(12) United States Patent
Uchida

(10) Patent No.: US 7,084,426 B2
(45) Date of Patent: Aug. 1, 2006

(54) ORGANIC ELECTROLUMINESCENT DEVICE, METHOD OF MANUFACTURING THE SAME, AND ELECTRONIC APPARATUS

(75) Inventor: Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/009,154

(22) Filed: Dec. 13, 2004

(65) Prior Publication Data

US 2005/0127360 A1      Jun. 16, 2005

(30) Foreign Application Priority Data

Dec. 16, 2003   (JP)   ............................. 2003-418011
Sep. 24, 2004   (JP)   ............................. 2004-276589

(51) Int. Cl.
*H01L 29/08*   (2006.01)
*H01L 29/80*   (2006.01)
*H01L 21/00*   (2006.01)

(52) U.S. Cl. .................. 257/40; 257/79; 257/257; 257/291; 438/20; 438/30

(58) Field of Classification Search .................. 438/20, 438/30; 257/10, 40, 257, 258, 291, 88, 79
See application file for complete search history.

(56) References Cited

U.S. PATENT DOCUMENTS 6,525,466 B1    2/2003  Jabbour et al.
2004/0214038 A1*  10/2004  Kwong et al. .............. 428/690

FOREIGN PATENT DOCUMENTS

| JP | A 10-270172 | 10/1998 |
| JP | A 10-289784 | 10/1998 |
| JP | A 11-162646 | 6/1999 |
| JP | A 2000-133458 | 5/2000 |
| JP | A 2001-332388 | 11/2001 |

* cited by examiner

Primary Examiner—Hsien-Ming Lee
(74) Attorney, Agent, or Firm—Oliff & Berridge, PLC

(57) ABSTRACT

To provide an organic EL device which, with simple configuration, exhibits a high brightness, a high light-emitting efficiency and a long life span in organic light-emitting layers for all colors, and has excellent conservation stability to heat. An organic EL device of the present invention has a laminate comprising an anode and a cathode with an organic light-emitting layer interposed therebetween. The organic light-emitting layer is made of a high-molecular-weight light-emitting material. Further, the cathode comprises a first layer made of fluoride or oxide of an alkali metallic material, fluoride or oxide of an alkali earth metallic material, or complex or compound of an organic material, and a second layer made of a magnesium alloy. Here, the first layer and the second layer are sequentially deposited on the organic light-emitting layer.

12 Claims, 14 Drawing Sheets

ORGANIC ELECTROLUMINESCENT DEVICE, METHOD OF MANUFACTURING THE SAME, AND ELECTRONIC APPARATUS

BACKGROUND

The present invention relates to an organic electroluminescent device, a method of manufacturing the same, and an electronic apparatus including the organic electroluminescent device.

As an organic electroluminescent device (hereinafter, referred to as an organic EL device), in Patent Document 1, an organic electroluminescent device having a configuration in which an organic light-emitting layer made of a high-molecular-weight light-emitting material is provided between a cathode and an anode, is disclosed.

[Patent Document 1] Japanese Unexamined Patent Application Publication No. 2001-332388.

SUMMARY

In the organic EL device disclosed in Patent Document 1, the organic light-emitting layer is made of the high-molecular-weight light-emitting material, and, as a cathode, one containing a material, such as calcium, which has a work function of 3.0 eV (electron volt) or less is used. Meanwhile, in an organic EL device made of a low-molecular-weight light-emitting material, generally, an organic light-emitting layer is made of an organic material having electron transporting property whose lowest unoccupied molecular orbital (LUMO) level is in a range of from 3.0 eV to 3.5 eV. Further, as a cathode, a material, such as magnesium, having a work function of about 3.5 eV is used. For example, the organic light-emitting layer is made by adding a dopant corresponding to each color to tris (8-quinolinolato) aluminum (hereinafter, referred to as $Alq_3$), and an LUMO level of $Alq_3$ is 3.1 eV. Meanwhile, an LUMO level of a high-molecular-weight light-emitting material which is used for an organic EL device with the high-molecular-weight light-emitting material is lower by about 1.0 eV than the low-molecular-weight light-emitting materials for the same light-emitting color. Therefore, in the case of the high-molecular-weight light-emitting material, as compared to the low-molecular-weight light-emitting material, it is needed to use a material having a relatively low work function, that is, a material having high reactivity, as a cathode.

Further, an LUMO level of a high-molecular-weight light-emitting material which is used for a full color organic EL device is different for every light-emitting color. In a light-emitting material emitting B (blue), since a highest occupied molecular orbital (HOMO) is the same, it is required to lower an LUMO level so as to increase color purity. Therefore, in the high-molecular-weight light-emitting material emitting B (blue), a material having a LUMO level of about 2.0 eV has more preferable color purity. As a result, the LUMO level of the light-emitting material emitting B (blue) is made lower than the LUMO level of a light-emitting material emitting G (green) or a light-emitting material emitting R (red). Here, calcium is responsible for promoting electron injection. In a full color organic EL device made of the high-molecular-weight light-emitting material, a cathode including a material, such as calcium, having a work function of 3.0 eV (electron volt) or less may be provided. In this case, however, since the LUMO levels of the organic light-emitting layers respectively emitting different colors are very different from each other, there is a problem in that favorable characteristics to the organic light-emitting layers emitting the respective colors cannot be obtained. For example, both the organic light-emitting layer emitting R (red) and the organic light-emitting layer emitting G (green) have the same LUMO levels of about 3.3 eV and exhibit relatively high efficiency, in addition to having a long life spans. However, the organic light-emitting layer emitting B (blue) has the LUMO level of about 2.0 eV and exhibits relatively a low efficiency and a long life span. That is, if a common cathode is made of a material, such as calcium, having a work function of 3.0 eV or less, to promote the electron injection, a large difference between the work functions of the organic light-emitting layers respectively emitting different colors and the cathode is caused. Therefore, in the organic light-emitting material emitting B (blue), the balance between the hole and electron injections collapses, and then it is difficult to realize the organic light-emitting layer for every color to have a high efficiency and a long life span. Further, if a material having a low work function such as calcium is used as the cathode, it is likely to react with oxygen, moisture or the organic light-emitting layer, and consequently it becomes difficult to realize a long life span for the color organic EL devices.

The present invention is made in consideration of the above problems, and it is an object of the present invention to provide an organic EL device which, with simple configuration, exhibits a high brightness, a high light-emitting efficiency and a long life span in a full color organic light-emitting layer, and has excellent conservation stability to heat. In addition, it is another object of the present invention to provide an electronic apparatus including the organic EL device.

In order to solve the above problems and achieve the above objects, according to the present invention, there is provided an organic electroluminescent device comprising a plurality of organic light-emitting elements each having a laminate of an anode and a cathode with an organic light-emitting layer interposed therebetween. In the organic electroluminescent device, the organic light-emitting layer is made of a high-molecular-weight light-emitting material, and the plurality of organic light-emitting elements includes a first organic light-emitting element having a first organic light-emitting material which has a first lowest unoccupied molecular orbital (LUMO) level of a highest LUMO level among organic light-emitting materials constituting the plurality of organic light-emitting elements, and a second organic light-emitting element having a second organic light-emitting material which has a second LUMO level of a lowest LUMO level among the organic light-emitting materials constituting the plurality of organic light-emitting elements. Further, the cathode is formed common to the first organic light-emitting element and the second organic light-emitting element, and the cathode has a first layer made of a fluoride or oxide of an alkali metallic material, a fluoride or oxide of an alkali earth metallic material, or a complex or compound of an organic material, and a second layer containing atoms in which the difference between work functions of the atoms and the first LUMO level is less than 0.7 eV. Here, the first layer and the second layer are sequentially deposited on the organic light-emitting layer.

Further, according to a preferred aspect of the present invention, in the above-mentioned invention, the first LUMO level is in a range of from 3.0 eV to 3.5 eV, the second LUMO level is in a range of from 2.0 eV to 2.5 eV, and the second layer contains atoms whose work functions are in a range of from 3.0 eV to 4.0 eV.

Further, according to a preferred aspect of the present invention, in the above-mentioned invention, the first layer is made of lithium fluoride, and the difference between the work functions of at least one of the atoms constituting the second layer and the second LUMO level is less than 2.0 eV.

By doing so, it is possible to alleviate a barrier at the time when an electron is injected from the second layer into the organic light-emitting layer having the highest LUMO level among the plurality of organic light-emitting layers. Therefore, in the case of applying to a full color organic EL device with a high-molecular-weight light-emitting material, even when the LUMO levels of the organic light-emitting layers emitting the respective colors are very different, it is possible to allow the organic light-emitting layers emitting the respective colors to have a high brightness, a high light-emitting efficiency and a long life span.

In addition, if doing so, in the organic EL device with the high-molecular-weight light-emitting material, it is possible to use a material, such as magnesium, having lower reactivity than that of calcium, as the second layer. Therefore, it is possible to reduce deterioration of the organic EL device due to reactions to moisture, oxygen or the organic light-emitting layer. Further, it is possible to realize the organic EL device which exhibits a high brightness, a high light-emitting efficiency and a long life span and has excellent conservation stability to heat.

In such a manner, in the organic EL device, the cathode has a laminated structure of the first layer and the second layer, and the second layer is made of an alloy containing the atoms whose work functions are in the range of from 3.0 eV to 4.0 eV, and preferably, an alloy containing the atoms whose work functions are in the range of from 3.5 eV (electron volt) to 4.0 eV. Thus, it is possible to provide the organic EL device which exhibits a high brightness, a light-emitting efficiency and a long life span, regardless of the colors of the organic light-emitting layers. Further, there is no need for using different materials for the respective colors of the organic light-emitting layers. Thus, it is possible to obtain a favorable brightness, efficiency and a life span with the common cathode to the respective colors. Further, it becomes possible to reduce a manufacturing cost with very simple configuration. That is, in the case in which the organic light-emitting layers emit different colors for every pixel unit, even though the cathode is commonly formed for the organic light-emitting layers of the respective colors, it is possible to provide the organic EL device which exhibits high brightness, high light-emitting efficiency and a life span. As the atoms whose work functions are in the range of from 3.0 eV to 4.0 eV, magnesium (a work function of 3.66 eV), scandium (a work function of 3.5 eV), yttrium (a work function of 3.1 eV), lanthanum (a work function of 3.5 eV), arsenic (a work function of 3.75 eV) or the like is exemplified, and magnesium is the most preferable.

Further, according to a preferred aspect of the present invention, in the above-mentioned invention, the second layer constituting the cathode is made of one or more alloys selected from an alloy of magnesium and silver, an alloy of magnesium and aluminum, and an alloy of magnesium and chromium. Since these alloys have particularly excellent thermal stability, it becomes possible to further increase conservation stability of the organic EL device.

Further, in the organic EL device of the present invention, the second layer constituting the cathode may constitute an outermost layer of the laminate. In this case, since the outermost layer of the cathode is constituted by the second layer, according to the thickness of the second layer, it is possible to provide a suitable organic EL device. In particular, if the second layer is made of a thin film, it is possible to a top emission type organic EL device, and if the second layer is made of a thick film, it is possible to provide a bottom emission type organic EL device. Moreover, in the present specification, a side of the cathode facing the organic light-emitting layer is referred to as an inside, and an opposite side is referred to as an outside. In addition, even though the second layer constitutes the outermost layer of the laminate, it is possible to form the second layer with a material having low reactivity. Thus, it is possible to reduce reactions of the cathode to moisture, oxygen or the organic light-emitting layer. Therefore, it is possible to further improve stability or reliability of the organic EL device with the high-molecular-weight light-emitting material.

Alternatively, on an outer layer of the second layer, a transparent electrode may be provided. In the case of which the second layer of the cathode is made of the thin film to form the top emission type organic EL device, it is apprehended that the resistance of the cathode increases and then light-emitting efficiency is lowered. In this case, however, by providing the transparent electrode such as ITO on the outside of the second layer, it is possible to realize the cathode having low resistance while maintaining transmittance. In addition, it is possible to use a material, such as magnesium, having lower reactivity than that of calcium, as the second layer. Thus, even though the transparent electrode is provided on the outer layer of the second layer, it is possible to reduce reactions of the transparent electrode such as ITO and the cathode. Therefore, it is possible to further improve stability or reliability of the organic EL device with the high-molecular-weight light-emitting material.

Besides, on an outer layer of the second layer, a protective film represented by $SiO_xN_y$ (where x and y are integers) may be provided. In this case, a protection effect to the cathode is obtained, and then it is possible to further improve conservation stability. Further, since the material, such as magnesium, having lower reactivity than that of calcium can be used as the second layer. Thus, even though the transparent electrode is provided on the outer layer of the second layer, it is possible to reduce reactions of the protective film represented by $SiO_xN_y$ (where x and y are integers) and the cathode. Further, it is possible to further improve stability or reliability of the organic EL device with the high-molecular-weight light-emitting material.

Further, the second layer may have an inclination such that the composition ratio of magnesium decreases toward the outer layer thereof. In such a manner, by adopting the configuration in which the composition ratio of magnesium decreases toward the outside of the cathode, it becomes possible to make the resistance of the cathode in its thicknesswise direction different. Moreover, in the second layer, the weight ratio of magnesium to other metallic material may be about 10:1 to 1:10, for example. It is apprehended that if the amount of magnesium is too much, conservation stability is deteriorated, and if the amount of magnesium is too little, the function of the cathode is lowered.

Further, an electronic apparatus of the present invention comprises an organic electroluminescent device described above. Thus, it is possible to provide the electronic apparatus which has a long life span and is capable of bright display.

In order to solve the above problems and achieve the above objects, in the present invention, there is provided an organic electroluminescent device comprising an organic light-emitting element having a laminate of an anode and a cathode with an organic light-emitting layer interposed therebetween. In the organic electroluminescent device, the organic light-emitting layer is made of a high-molecular-weight light-emitting material, and the organic light-emitting element has the organic light-emitting layer whose LUMO level is in a range of from 2.0 eV to 2.5 eV. Further, the cathode comprises a first layer made of lithium fluoride and a second layer made of one or more alloys selected from an alloy of magnesium and silver, an alloy of magnesium and aluminum, and an alloy of magnesium and chromium. Here, the first layer and the second layer are sequentially deposited on the organic light-emitting layer.

Conventionally, it is needed to use a material having relatively high reactivity such as calcium as the cathode with respect to the organic light-emitting layer whose LUMO level is in the range of from 2.0 eV to 2.5 eV. In the present invention, by adopting the above-mentioned configuration, in the organic EL device with the high-molecular-weight light-emitting material, it is possible to use the material, such as magnesium, having lower reactivity than that of calcium, as the second layer. Therefore, it is possible to reduce deterioration of the organic EL device due to reactions to moisture, oxygen or the organic light-emitting layer. Further, it is possible to realize the organic EL device which exhibits a high brightness, a light-emitting efficiency and a long life span, and has excellent conservation stability to heat.

In order to solve the above problems and achieve the above object, in the present invention, there is provided a method of manufacturing an organic electroluminescent device. The method comprises a step of forming an anode on a substrate, a step of forming a functional layer including an organic light-emitting layer on the anode with a liquid method, a step of forming a first cathode layer made of a fluoride or oxide of alkali metallic material, a fluoride or oxide of alkali earth metallic material, or a complex or compound of an organic material, on the functional layer, and a step of forming a second cathode layer made of one or more alloys selected from an alloy of magnesium and silver, an alloy of magnesium and aluminum, and an alloy of magnesium and chromium, on the first layer of the cathode.

As compared to a case of using a single substance of magnesium, by using a magnesium alloy, it is possible to reduce reactions to the material used for the first layer, for example, lithium fluoride, and it is possible to reduce diffusions of atoms constituting the first layer into the organic light-emitting layer which is formed with the liquid method.

Further, according to a preferred aspect of the present invention, an electronic apparatus comprises any one of the organic electroluminescent devices described above. According to this invention, it is possible to provide the electronic apparatus which exhibits a high brightness, a high light-emitting efficiency and a long life span, and has excellent conservation stability to heat.

DETAILED DESCRIPTION OF EMBODIMENTS

<Organic Electroluminescent Device>

Hereinafter, an embodiment of an organic electroluminescent device (an organic EL device) of the present invention will be described with reference to the drawings.

Figure 1:
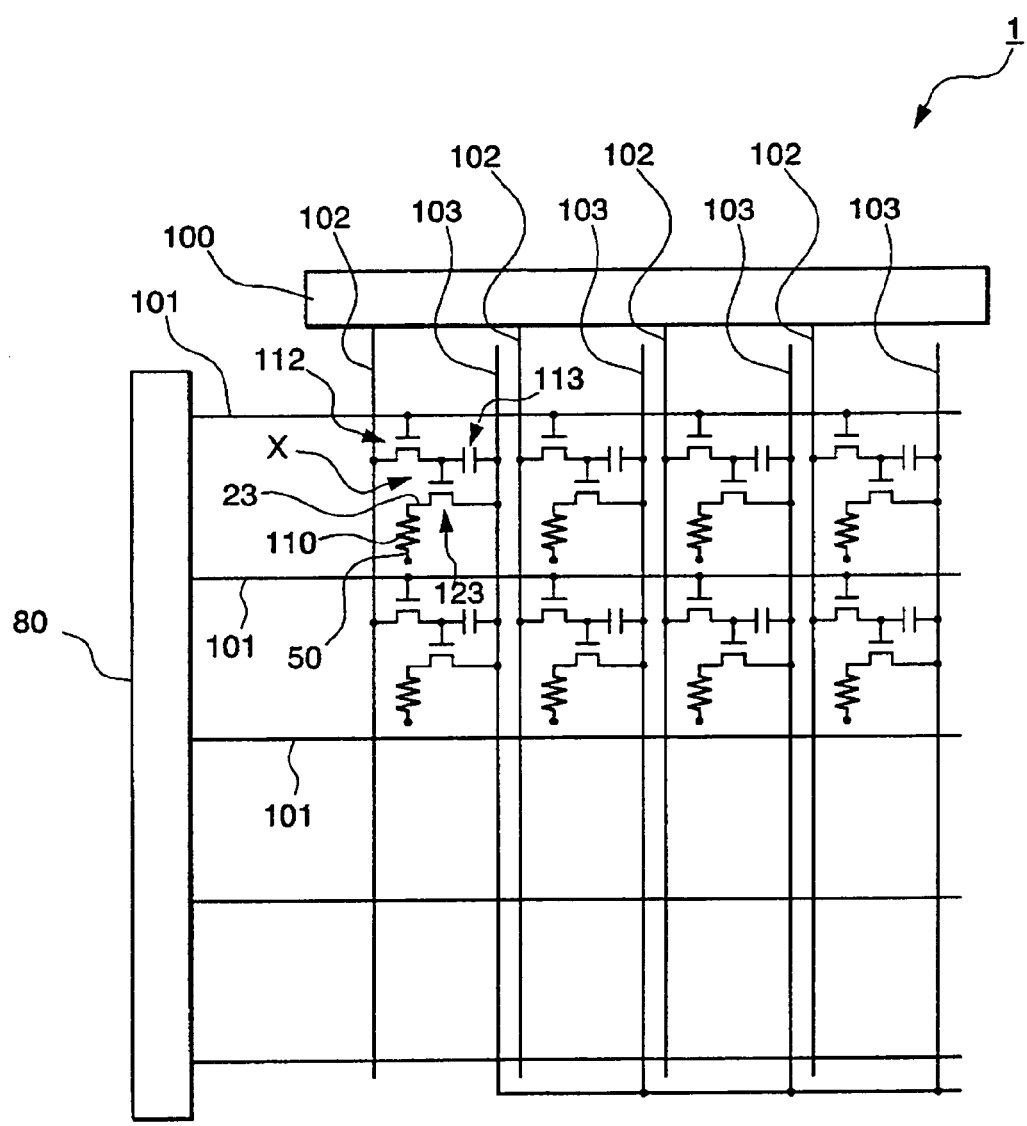
FIG. 1 is a schematic view showing a wiring line structure of an organic EL device according to an embodiment of the present invention.

FIG. 1 is a diagram showing schematically a wiring line structure of the organic EL device of the present embodiment.

The organic EL device 1 is an active matrix type display device in which a thin film transistor (hereinafter, referred to as a TFT) is used as a switching element.

As shown in FIG. 1, the organic EL device 1 has a wiring line structure comprising a plurality of scanning lines 101 . . . , a plurality of signal lines 102 . . . extending in a direction orthogonal to the respective scanning lines 101, and a plurality of power supply lines 103 . . . extending parallel to the respective signal lines 102. Further, in the vicinities of respective intersections of the scanning lines 101 . . . and the signal lines 102 . . . , pixel regions X . . . are provided.

To the signal lines 102, a data driving circuit 100 comprising shift registers, level shifters, video lines and analog switches is connected. Further, to the scanning lines 101, a scanning line driving circuit 80 comprising shift registers and level shifters is connected.

In the respective pixel regions X, a switching TFT 112 of which a gate electrode is supplied with a scanning signal via the scanning line 101, a storage capacitor 113 for storing a pixel signal which is supplied from the signal line 102 via the switching TFT 112, a driving TFT 123 of which a gate is supplied with the pixel signal stored in the storage capacitor 113, a pixel electrode (an anode) 23 into which a driving current flows from the power supply line 103, when being electrically connected to the power supply line 103 via the driving transistor 123, a cathode made of a first cathode layer and a second cathode layer 50, and a functional layer 110 interposed between the pixel electrode 23 and the cathode are provided. The pixel electrode 23, the cathode and the functional layer 110 constitute an organic light-emitting element (organic EL element) as a laminate.

According to the organic EL device 1, if the scanning line 101 is driven and the switching TFT 112 is turned on, a potential on the signal line 102 at that moment is stored in the storage capacitor 113, and depending on a state of the storage capacitor 113, on or off state of the driving transistor 123 is determined. And then, the current flows in the pixel electrode 23 from the power supply line 103 via a channel of the driving transistor 123, and further the current flows in the second cathode layer 50 via the functional layer 110. The functional layer 110 emits a light depending on the amount of the current flowing therein.

Next, a specified configuration of the organic EL device 1 of the present embodiment will be described with reference to FIGS. 2 to 5.

To begin with, a planar structure of the organic EL device 1 of the present embodiment will be described with reference to FIG. 2. The organic EL device 1 of the present embodiment comprises an electrically insulating substrate 20, a pixel electrode region (not shown) on which the pixel electrodes connected to the switching TFTs (not shown) are arranged in a matrix on the substrate 20, a power supply line (not shown) arranged around the pixel electrode region and connected to the respective pixel electrodes, and a pixel portion 3 (in FIG. 2, within a one-dot-chain line frame) having an approximately rectangular shape in a plan view, which is positioned on at least the pixel electrode region. Moreover, in the present invention, the substrate 20, the switching TFTs or various circuits, and interlayer insulating films formed on the substrate 20, as described below, are collectively referred to as a base substrate.

The pixel portion 3 is divided into an actual display region 4 (in FIG. 2, within a two-dot-chain line frame) of a central portion and a dummy region 5 (a region between the one-dot-chain line and the two-dot-chain line) arranged around the actual display region 4. In the actual display region 4, display regions R, G and B each having the pixel electrode are arranged in a matrix to be spaced apart from each other in the directions of the lines A-B and C-D. Further, at both sides of the actual display region 4 in FIG. 2, the scanning line driving circuits 80 and 80 are arranged. The scanning line driving circuits 80 and 80 are provided to position below the dummy region 5.

Figure 2:
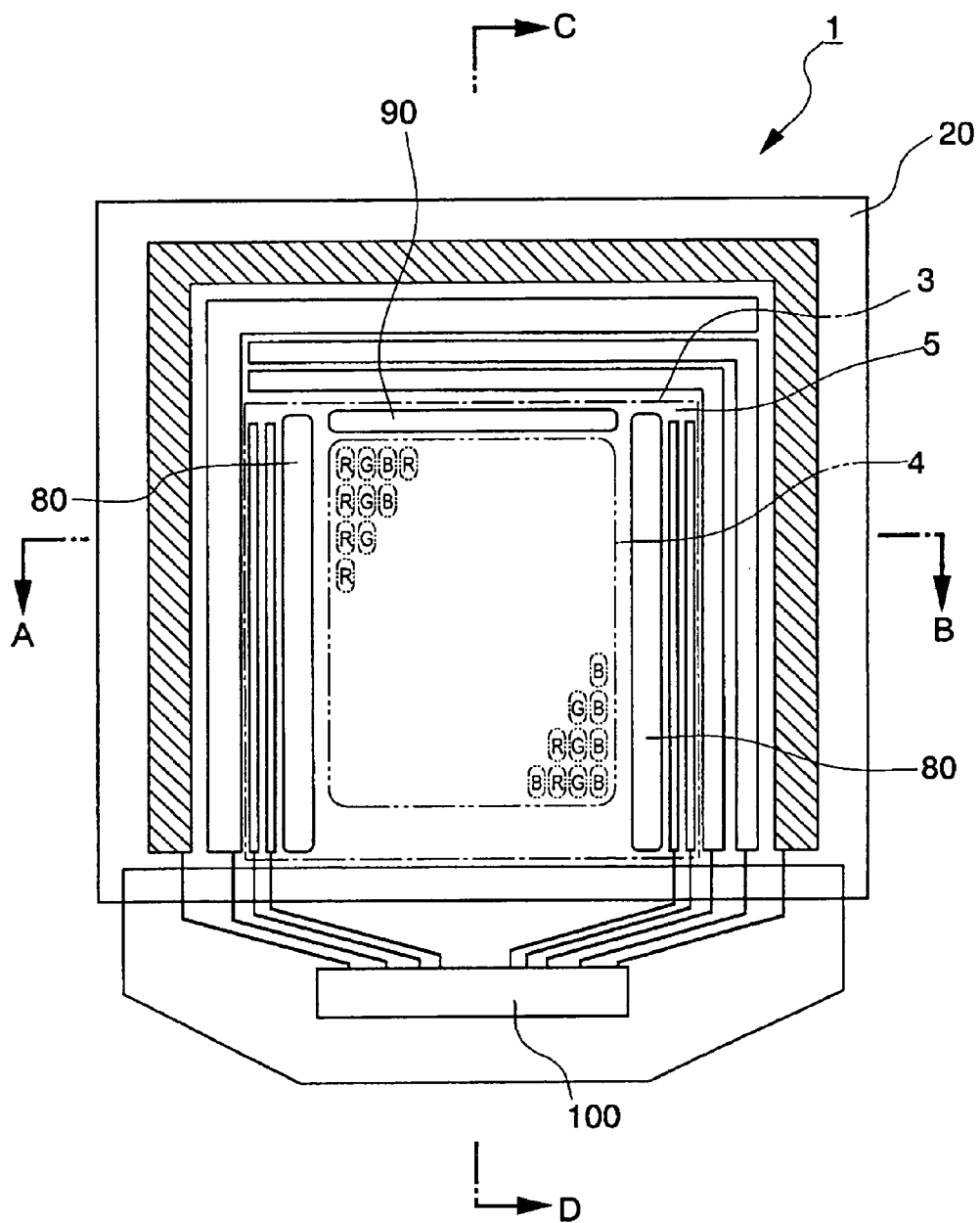
FIG. 2 is a plan view showing schematically a configuration of the organic EL device.

Further, on an upper side of the actual display region 4 in FIG. 2, a test circuit 90 is arranged. The test circuit 90 is a circuit for testing operating conditions of the organic EL device 1. For example, the test circuit 90 comprises test information output means (not shown) for outputting test results to the outside. The test circuit 90 is constructed to test the quality and defects of a display device during manufacture or at the time of shipment. Further, the test circuit 90 is also provided to position below the dummy region 5.

Figure 3:
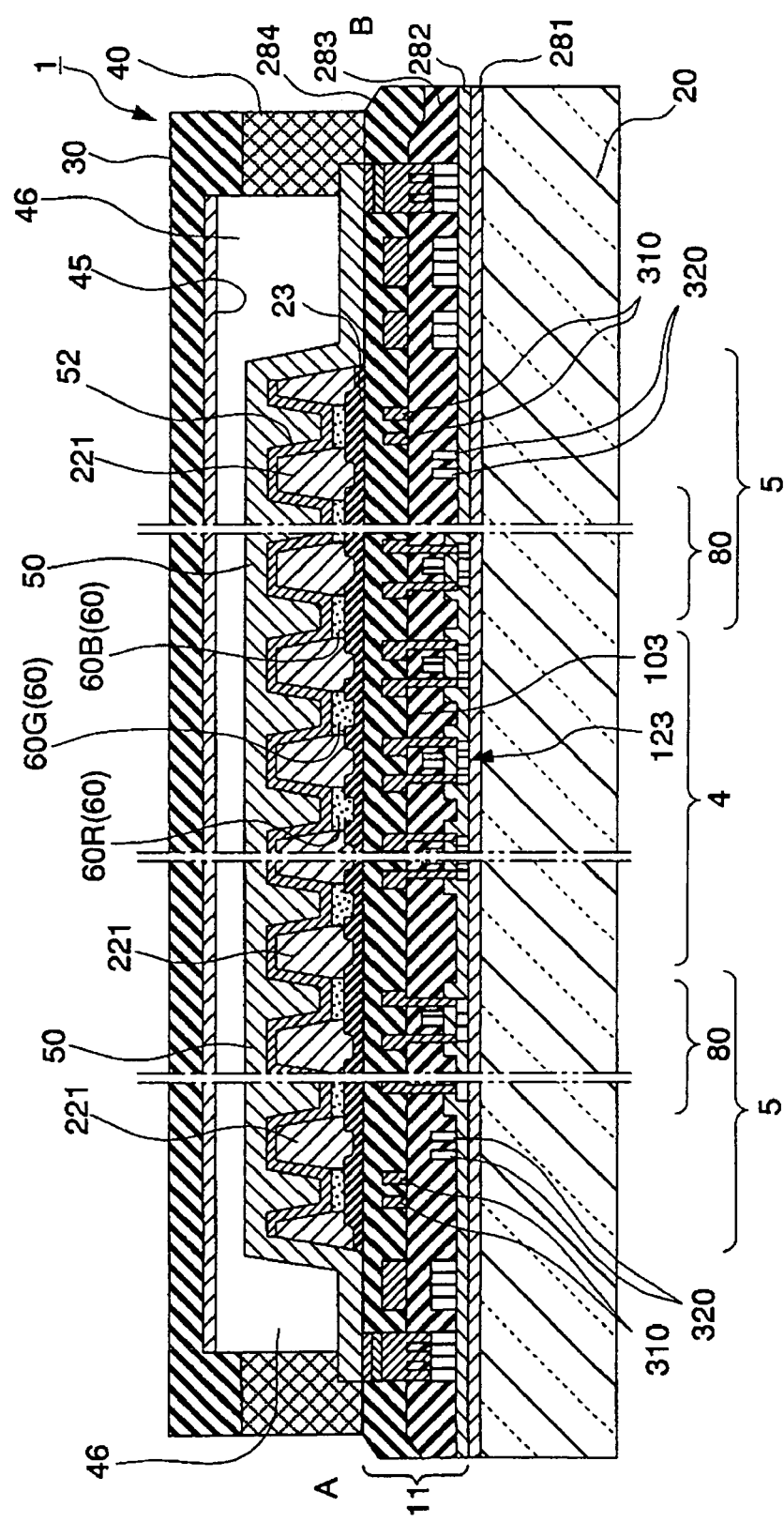
FIG. 3 is a cross-sectional view taken along the line A-B of FIG. 2.
Figure 4:
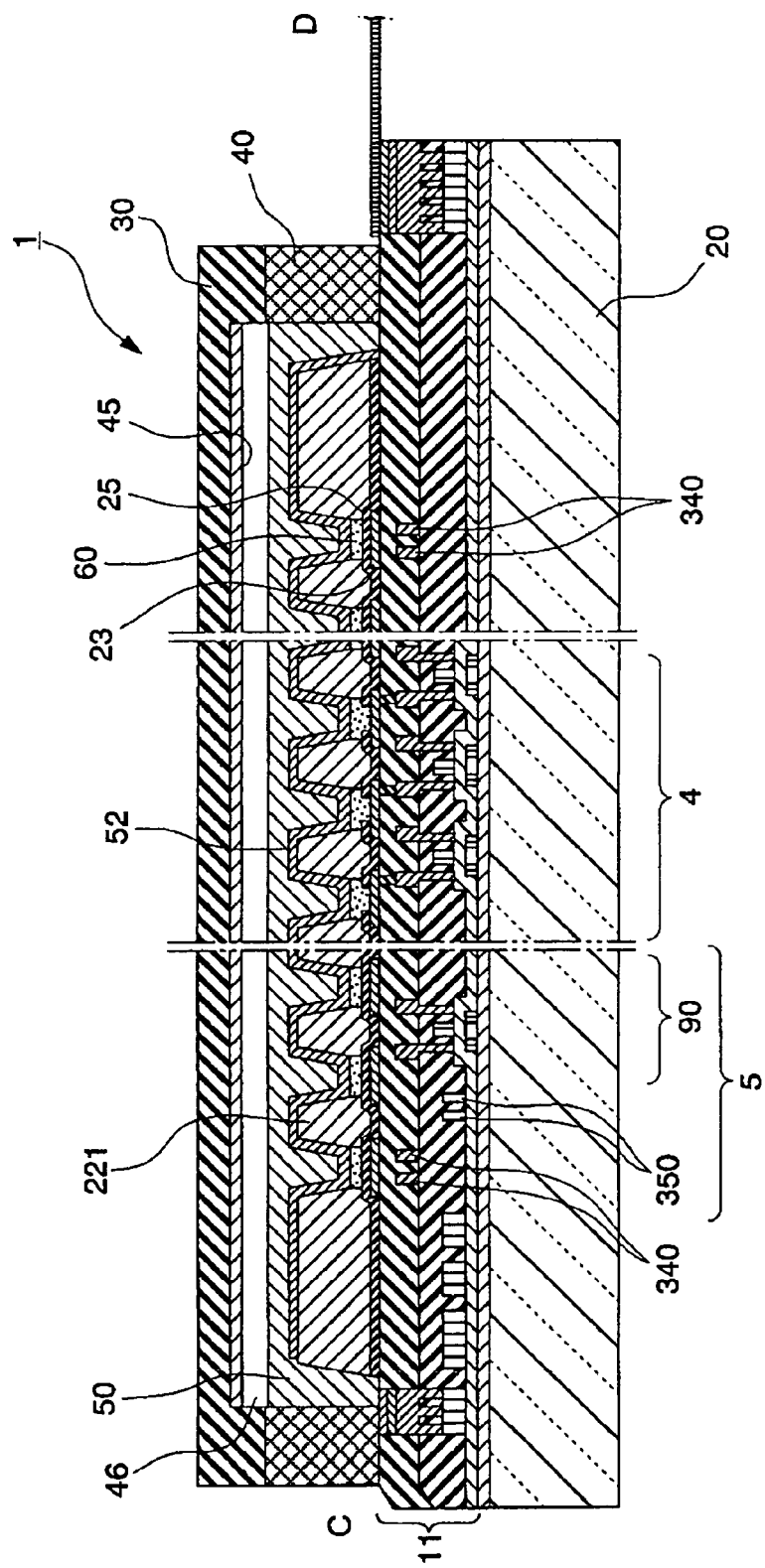
FIG. 4 is a cross-sectional view taken along the line C-D of FIG. 2.

Driving voltages of the scanning line driving circuits 80 and the test circuit 90 are applied from a predetermined power supply unit via driving voltage connecting portions 310 (see FIG. 3) and driving voltage connecting portions 340 (see FIG. 4). Further, driving control signals and driving voltages are transmitted and applied from a predetermined main driver for controlling the operation of the organic EL device 1 to the scanning line driving circuits 80 and the test circuit 90 via driving control signal connecting portion 320 (see FIG. 3) and driving voltage connecting portions 350 (see FIG. 4). Moreover, in this case, the driving control signals are instruction signals from the main driver related to controls at the time when the scanning line driving circuits 80 and the test circuit 90 output signals.

Figure 5:
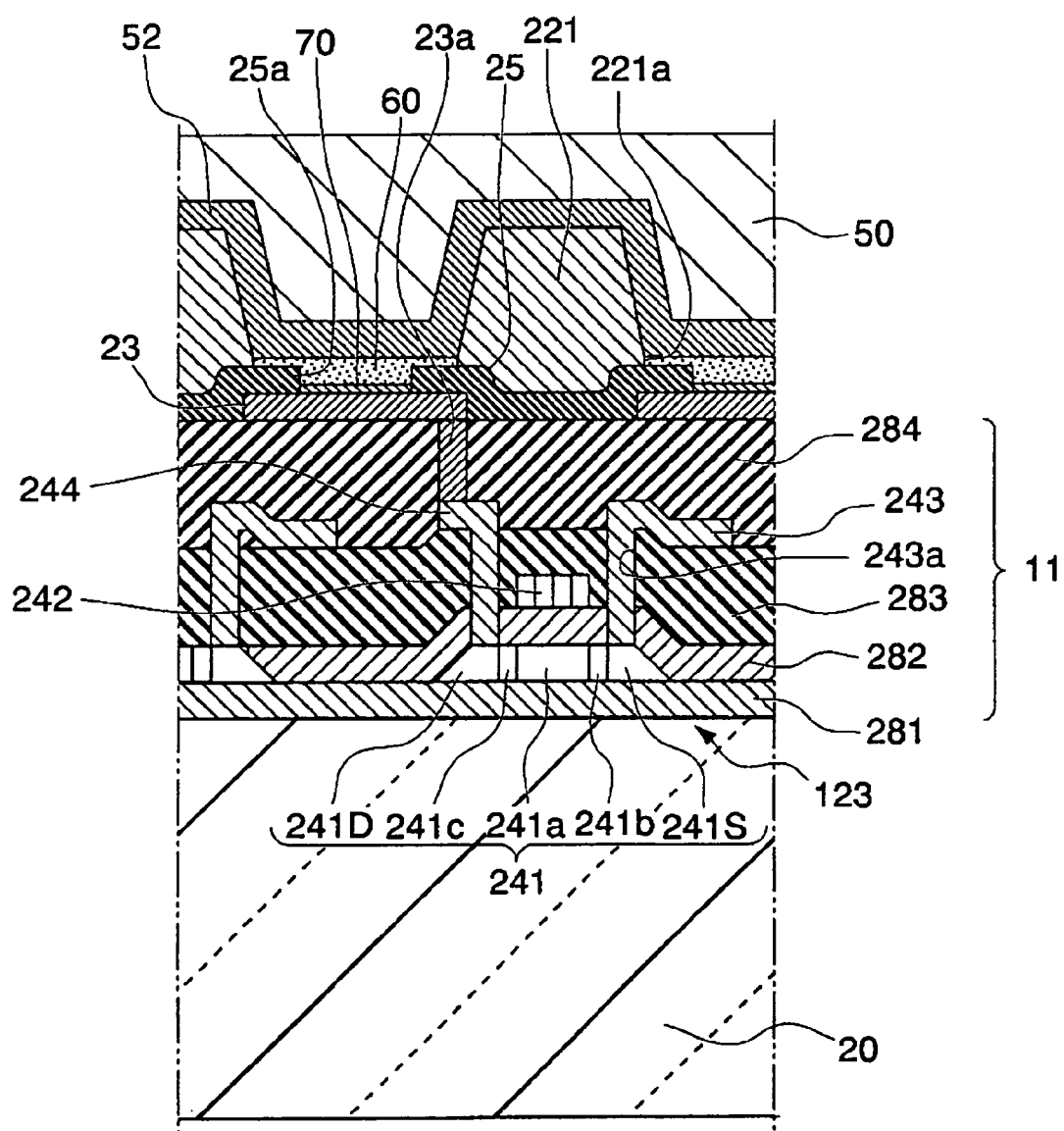
FIG. 5 is an expanded cross-sectional view of essential parts of FIG. 3.

Next, a cross-sectional structure of the organic EL device will be described with reference to FIGS. 3 to 5. FIGS. 3 and 4 are cross-sectional views taken along the line A-B of FIG. 2, and FIG. 5 is an expanded diagram showing essential parts thereof. As shown in FIGS. 3 and 4, the substrate 20 and a sealing substrate 30 are attached by means of a sealing resin 40, thereby forming the organic EL device 1.

As the substrate 20, in the case of a so-called bottom emission organic EL device in which emitted light is derived from the substrate 20 side, a transparent or translucent material is adopted. For example, glass, quartz, resin (plastic, plastic film) or the like may be exemplified, and, in particular, a low-priced soda glass substrate is suitably used.

Further, in the case of a so-called top emission organic EL device in which emitted light is derived from the sealing substrate 30 side at a side opposite to the substrate 20, any one of a transparent substrate and a non-transparent substrate may be used as the substrate 20. As the non-transparent substrate, for example, other than one in which an insulation treatment such as surface oxidization is performed on ceramic such as alumina, or a metallic sheet such as stainless steel, thermosetting resin or thermoplastic resin is exemplified.

As the sealing substrate 30, for example, an electrically insulating plate-shaped member may be adopted. In particular, in the case of the top emission type, as the sealing substrate 30, a transparent substrate such as glass, quartz, resin or the like is adopted. Further, the sealing resin 40 is made of, for example, thermosetting resin or ultraviolet hardening resin. In particular, epoxy resin, which is a kind of thermosetting resin, is preferable.

Further, on the substrate 20, circuit portions 11 having driving TFTs 123 for driving the pixel electrodes 23 are formed, and light-emitting elements are provided thereon. As shown in FIG. 5, each light-emitting element has a configuration in which the pixel electrode 23, the functional layer 110 (see FIG. 1) mainly comprising the organic light-emitting layer 60, and the cathode made of the first cathode layer (an electron injecting layer) 52 and the second cathode layer 50 are sequentially deposited.

The pixel electrode 23 functions as the anode which supplies holes to the organic light-emitting layer 60. As the pixel electrode 23, for example, in the case of the bottom emission type, a transparent conductive material of ITO (indium tin oxide) or indium oxide/zinc oxide-based amorphous transparent conductive film (indium zinc oxide: IZO) (Registered Trademark) (manufactured by Idemitsu Kosan Co., Ltd.) is used. Further, in the case of the top emission type, the pixel electrode 23 is not limited to the transparent conductive material, and, for example, a light reflective or non-transparent conductive material such as aluminum (Al) or silver (Ag) may be used.

As the organic light-emitting layer 60, well-known high-molecular-weight light-emitting materials capable of emitting fluorescent light or phosphorescent light are used. More specifically, for example, polyfluorene derivatives (PF), polyparaphenylenevinylene derivatives (PPV), polyphenylene derivatives (PP), polyparaphenylene derivatives (PPP), polyvinylcarbazole (PVK), polythiophene derivatives, polydialkylfluorene (PDAF), polyfluorenebenzothiadiazole (PFBT), polyalkylthiophene (PAT), poly(2,7-(9,9-di-n-octylfluorene)-(1,4-phenylene-((4-methylphenyl)imino)-1,4-phenylene-((4-methylphenyl)imino)-1,4-phenylene)) (PFM), poly(2,7-(9,9-di-n-octylfluorene)-(1,4-phenylene-((4-methoxyphenyl)imino)-1,4-phenylene-((4-methoxyphenyl)imino)-1,4-phenylene)) (PFMO), or a polysilane-based material, such as poly(2,7-(9,9-di-n-octylfluorene)-3,6-benzothiadiazole) (F8BT) or polymethylphenylsilane (PMPS), is suitably used. Further, the organic light emitting layer may also be made of light-emitting materials in which, into these high molecular materials, low molecular materials, such as perylene-based pigments, coumarin-based pigments, or rhodamine-based pigment, rubrene, perylene, 9,10-diphenylanthracene, tetraphenylbutadiene, Nile red, coumalin 6 or quinacridone are doped.

As the high-molecular-weight light-emitting material emitting blue, for example, PFM represented by (Chemical Formula 1) or PFMO represented by (Chemical Formula 2) is suitably used, whose LUMO level is 2.1 eV or 2.0 eV. Further, as the high-molecular-weight light-emitting material emitting green, for example, F8BT represented by (Chemical Formula 3) is suitably used, whose LUMO level is 3.4 eV. In addition, as the high-molecular-weight light-emitting material emitting red, for example, PAT represented by (Chemical Formula 4) or poly(2,5-dialkoxy-P-phenylenevinylene) (PO-PPV) represented by (Chemical Formula 5)is suitably used, whose LUMO level is 3.3 eV or 3.2 eV).

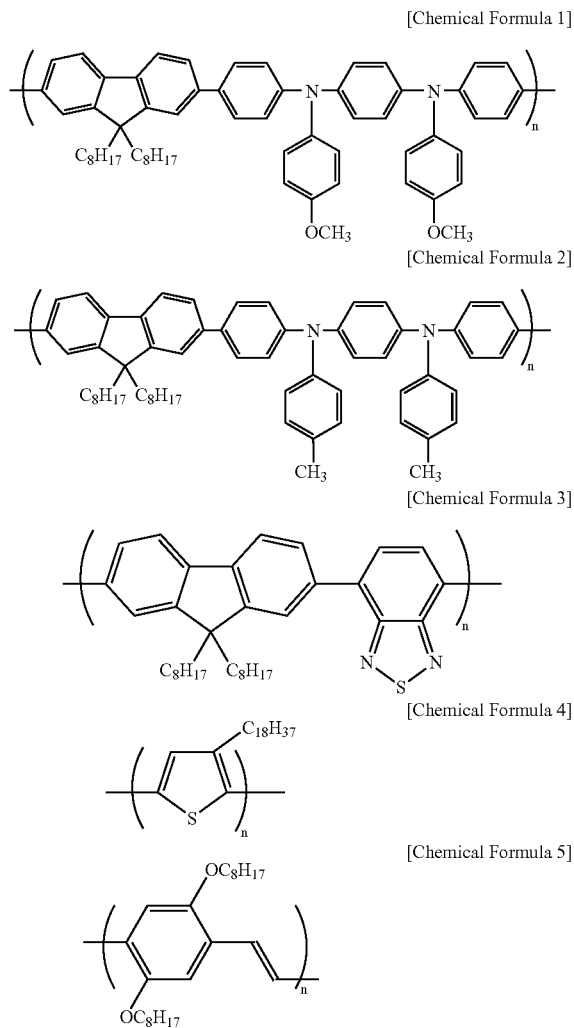

[Chemical Formula 1]

[Chemical Formula 2]

[Chemical Formula 3]

[Chemical Formula 4]

[Chemical Formula 5]

Moreover, the 'high-molecular weight' means a polymer whose molecular weight is larger than that of a so-called 'low-molecular weight' whose molecular weight is hundreds. In the high-molecular-weight material described above, other than a polymer having a molecular weight of 10000 or more, which is called as a high-molecule, low-molecule polymer having a molecular weight of 10000 or less, which is called as oligomer, is included. In the present embodiment, in order to perform full color display, the organic light-emitting layers 60 corresponding to R (red), G (green) and B (blue) are provided together in one pixel.

Further, in the present embodiment, if necessary, a hole injecting/transporting layer 70 (see FIG. 5) may be provided between the pixel electrode 23 and the organic light-emitting layer 60. By providing the hole injecting/transporting layer 70, electrons which is traveling in the organic light-emitting layer 60 is blocked efficiently, and a recombination probability of the holes and the electrons in the organic light-emitting layer 60 increases. As the hole injecting/transporting layer 70, materials having a low barrier to the electrons being injected from the pixel electrode 23 and a high hole mobility are suitably used. As such materials, for example, polythiophene derivatives, polypyrrole derivatives, or a material with doped into the derivatives is used. More specifically, a dispersion of 3,4-polyethylenedioxythiophene/polystyrenesulfonic acid (PEDOT/PSS), that is, a dispersion in which 3,4-polyethylenedioxythiophene is dispersed into a solvent of polystyrenesulfonic acid and then water is added is used.

As shown in FIGS. 3 to 5, the second cathode layer 50 has an area wider than a total area of the actual display region 4 and the dummy region 5 to cover them. The second cathode layer 50 is made of an alloy containing atoms whose work functions are in a range of from 3.0 eV to 4.0 eV. In the present embodiment, the second cathode layer 50 is made of an alloy of magnesium (Mg) and silver (Ag). Moreover, other than this alloy, an alloy of magnesium (Mg) and aluminum (Al) or an alloy of magnesium (Mg) and chromium (Cr) may be used. However, the vapor deposition of the alloy of magnesium (Mg) and chromium (Cr) is difficult. Thus, from the viewpoint of stability and manufacturing efficiency, it is preferable to use the alloy of magnesium (Mg) and silver (Ag). Moreover, the second cathode layer 50 has preferably a thickness of 50 nm or more, and in the present embodiment, the thickness is set to about 200 nm. Further, as the atoms having the work functions between 3.0 eV and 4.0 eV which are used for the second cathode layer 50, scandium (the work function of 3.5 eV), yttrium (the work function of 3.1 eV), lanthanum (the work function of 3.5 eV), arsenic (the work function of 3.75 eV) or the like may be used.

Next, in the present embodiment, in order to increase electron injection efficiency from the second cathode layer 50 to the organic light-emitting layer 60, the first cathode layer (the electron injecting layer) 52 is provided between the second cathode layer 50 and the organic light-emitting layer 60. The first cathode layer (the electron injecting layer) 52 is made of a fluoride of an alkali metallic material, specifically, lithium fluoride (LiF). However, the first cathode layer 52 may be made of, other than the fluoride, for example, an oxide of an alkali metallic material, a chloride of an alkali metallic material, a fluoride or oxide of an alkali earth metallic material, or a complex or compound of an organic material.

Examples of the respective materials are as follows. First, as the fluoride of the alkali metallic material, sodium fluoride (NaF) or potassium fluoride (KF) is exemplified, and as the oxide of the alkali metallic material, lithium oxide ($Li_2O$), sodium oxide ($Na_2O$) or potassium oxide ($K_2O$) is exemplified. Further, as the fluoride of the alkali earth metallic material, magnesium fluoride ($MgF_2$) or calcium fluoride ($CaF_2$) is exemplified, and as the oxide of the alkali earth metallic material, magnesium oxide (MgO) or calcium oxide (CaO) is exemplified. In addition, as the complex or compound of the organic material, when a central atom made of a metallic element is M, a chelate ligand made of an organic material is A and a neutral ligand made of an organic material is B, an organic metallic compound represented by a general formula $MA_nB_m$ (where n is a valence of a center atom M and m is a natural number) may be exemplified. As such a complex, various structures of complexes such as chelate complexes or crown ether complexes may be used. The first cathode layer (the electron injecting layer) 52 made of such compounds has preferably a thickness of about 0.1 nm to about 10 nm, and in the present embodiment, the thickness is set to about 2 nm.

Moreover, in the present embodiment, the cathode is made of a laminate of the first cathode layer (the electron injecting layer) 52 and the second cathode layer 50. Further, between the pixel electrode (the anode) 23 and the cathode, the organic light-emitting layer 60 is interposed. Here, in the case of the bottom emission type, the configuration of the cathode does not matter particularly, but in the case of the top emission type, the cathode made of the first cathode layer (the electron injecting layer) 52 and the second cathode layer 50 is preferably to be thinned (for example, the film thickness of about 5 nm).

Next, a configuration of the circuit portion for driving the light-emitting elements will be described with reference to FIG. 5. As shown in FIG. 5, the circuit portion 11 is provided to position below the light-emitting element. The circuit portion 11 is formed on the substrate 20 to constitute the base substrate. That is, a base protective layer 281 made mainly of $SiO_2$ is formed on the surface of the substrate 20 as a base, and a silicon layer 241 is formed thereon. On the surface of the silicon layer 241, a gate insulating layer 282 made mainly of $SiO_2$ or SiN is formed. Among the silicon layer 241, a region overlapping a gate electrode 242 with the gate insulating layer 282 interposed therebetween becomes a channel region 241a. Moreover, the gate electrode 242 is a portion of the scanning line 101, which is not shown. Meanwhile, a first interlayer insulating layer 283 made mainly of $SiO_2$ is formed on the surface of the gate insulating layer 282 which covers the silicon layer 241 and on which the gate electrode 242 is formed.

Further, among the silicon layer 241, at a source side of the channel region 241a, a low-doped source region 241b and a high-doped source region 241S are provided, while at a drain side of the channel region 241a, a low-doped drain region 241c and a high-doped drain region 241D are provided, such that a so-called LDD (light doped drain) structure is formed. Among them, the high-doped source region 241S is connected to a source electrode 243 via a contact hole 243a which is opened over the gate insulating layer 282 and the first interlayer insulating layer 283. The source electrode 243 constitutes a portion of the above-mentioned power supply line 103 (see FIG. 1, and in FIG. 5, extend in a direction vertical to a paper from a position of the source electrode 243). Meanwhile, the high-doped drain region 241D is connected to a drain electrode 244, which is formed of the same layer as the source electrode 243, via a contact hole 244a which is opened over the gate insulating layer 282 and the first interlayer insulating layer 283.

An upper layer of the first interlayer insulating layer 283 in which the source electrode 243 and the drain electrode 244 are formed is covered with a second interlayer insulating layer 284 made mainly of acryl-based resin components. As the second interlayer insulating layer 284, materials other than acryl-based insulating film, for example, silicon compounds such as SiN or $SiO_2$ may be used. In such a manner, if the silicon compounds having high gas barrier property, in particular, silicon nitrogen compounds are used as the second interlayer insulating layer 284, even though the substrate main body 20 is made of a resin substrate having high moisture permeability, it is possible to prevent oxygen or moisture from being penetrated into the organic light-emitting layer 60 from the substrate side, and thus it is possible to lengthen the long life span of the light-emitting element. And then, on the surface of the second interlayer insulating layer 284, the pixel electrode 23 made of ITO is formed, and simultaneously the pixel electrode 23 is connected to the drain electrode 244 via a contact hole 23a which is provided in the second interlayer insulating layer 284. That is, the pixel electrode 23 is connected to the high-doped drain region 241D of the silicon layer 241 via the drain electrode 244.

Moreover, TFTs (TFTs for the driving circuit) provided in the scanning line driving circuits 80 and the test circuit 90, for example, N-channel type or P-channel type TFTs constituting an inverter which is provided in the shift registers have the same structure as that of the driving TFTs 123, except that they are not connected to the pixel electrodes 23.

On the surface of the second interlayer insulating layer 284 on which the pixel electrode 23 is formed, a bank structure made of the pixel electrode 23, a lyophilic control layer 25 and an organic bank layer 221 is provided. The lyophilic control layer 25 is mainly made of, for example, a lyophilic material such as $SiO_2$, and the organic bank layer 221 is made of, for example, acryl or polyimide. And then, on the pixel electrode 23 and within an opening portion 25a provided in the lyophilic control layer 25 and an opening 221a to be surrounded by the organic bank layer 221, the hole injecting/transporting layer 70 and the organic light-emitting layer 60 are sequentially deposited. Moreover, in the present embodiment, 'the lyophilic property' of the lyophilic control layer 25 is assumed to mean that the lyophilic control layer 25 has a lyophilic property higher than that of at least acryl or polyimide constituting the organic bank layer 221. The layers up to the second interlayer insulating layer 284 on the substrate 20 described above constitute the circuit portion 11.

In the organic EL device 1 having the above-mentioned configuration, the organic light-emitting layer 60 made of the high-molecular-weight light-emitting material is interposed between the cathode having the second cathode layer 50 and the first cathode layer (the electron injecting layer) 52, and the pixel electrode 23 as the anode, and simultaneously the second cathode layer 50 is made of the magnesium alloy. In such a manner, since the cathode has the laminated structure of the first cathode layer (the electron injecting layer) 52 and the second cathode layer 50 and further the second cathode layer 50 is made of the magnesium alloy, it is possible to allow a high brightness, a high light-emitting efficiency and a long life span to exhibit for the organic light-emitting layer 60 of any colors, irregardless of the colors of the organic light-emitting layer 60. More specifically, with the above-mentioned configuration, the injection of the electrons into the organic light-emitting layer 60 made of PFM or PFMO whose LUMO level is about 2.0 eV becomes favorable, and simultaneously the electrons may be injected into the organic light-emitting layer 60 made of F8BT, PAT or PO-PPV whose LUMO level is about 3.3 eV. Therefore, in all the organic light-emitting layers 60 emitting the respective colors, the injections of the electrons and the holes are balanced, and thus it is possible to allow high brightness and light-emitting efficiency to exhibit.

Further, as compared to the case in which the second cathode layer 50 of the cathode is made of a single substance of magnesium, the magnesium alloy used in the present embodiment is difficult to be oxidized, and then conservation stability becomes also excellent. Further, there is no need for making the materials for the respective colors of the organic light-emitting layers 60 different. Thus, the cathode configuration may be common for the respective colors, and then it is possible to obtain favorable brightness, efficiency and life span property. Further, with a very simple configuration, it is also possible to reduce the manufacturing cost. That is, even though the organic light-emitting layers 60 are configured to include the organic light-emitting layers 60 of different colors for every pixel, with simple configuration in which the cathode is configured to be common to the organic light-emitting layers 60 for each color, it is possible to allow a high brightness, a high light-emitting efficiency and a long life span to exhibit.

Further, in an organic EL device having the plurality of organic light-emitting layers which emit a plurality of colors, preferably, the LUMO level of the material constituting the organic light-emitting layer having the highest LUMO level among the plurality of organic light-emitting layers and the work function of the material of the second cathode layer 50 are approximately the same. Further, preferably, the first cathode layer (the electron injecting layer) 52 is formed between the organic light-emitting layer 60 and the second cathode layer 50, and the first cathode layer (the electron injecting layer) 52 is made of the fluoride of the alkali metallic material, the oxide of the alkali metallic material, the fluoride or oxide of the alkali earth metallic material, or the complex or compound of the organic material. Further, preferably, the difference between the LUMO level of the material constituting the organic light-emitting layer having the lowest LUMO level among the plurality of organic light-emitting layers, and the work function of the material constituting the second cathode layer 50 is less than 0.7 eV. If doing so, it is possible to alleviate the barrier at the time when the electrons are injected into the organic light-emitting layer having the highest LUMO level and the organic light-emitting layer having the lowest LUMO level among the plurality of organic light-emitting layers from the second cathode layer 50. In particular, if a semiconductor or an insulator having a band gap is used as the material of the first cathode layer (the electron injecting layer) 52, it is possible to promote the above-mentioned effects. In the case in which the work function of the material constituting the second cathode layer 50 is higher than the LUMO level of the material constituting the organic light-emitting layer having the lowest LUMO level among the plurality of organic light-emitting layers by more than 0.7 eV, the injection of the electrons into the organic light-emitting layer having the highest LUMO level among the plurality of organic light-emitting layers can not be performed efficiently. Further, in the case in which the work function of the material constituting the second cathode layer 50 is lower than the LUMO level of the material constituting the organic light-emitting layer having the lowest LUMO level among the plurality of organic light-emitting layers by more than 0.7 eV, stability or reliability of the organic EL device using the high-molecular-weight light-emitting material is deteriorated due to the reactions of the second cathode layer 50 to moisture, oxygen and the organic light-emitting layer 60.

More specifically, the LUMO level of the organic light-emitting layer having the highest LUMO level is about 3.3 eV, and the LUMO level of the organic light-emitting layer having the lowest LUMO level is about 2.0 eV. Thus, if the second cathode layer 50 is made of magnesium whose work function is 3.66 eV, it satisfies such a condition. If the difference between the LUMO level of the organic light-emitting layer having the lowest LUMO level, and the work function of the second cathode layer 50 is less than 2.0 eV, lithium fluoride is used as the first cathode layer (the electron injecting layer) 52, such that the film thickness may be optimized. Thus, it is possible to alleviate the barrier at the time when the electrons are injected from the second cathode layer 50 into the organic light-emitting layer 60. Therefore, the injections of the electrons and the holes in all the organic light-emitting layers 60 emitting the respective colors are balanced, and thus it is possible to allow high brightness and light-emitting efficiency to exhibit.

In addition, if doing so, in the organic EL device using the high-molecular-weight light-emitting material, as the second cathode layer 50, it is possible to use the material, such as magnesium, having lower reactivity than calcium. Therefore, it is possible to reduce the deterioration of the organic EL device due to the reactions of the second cathode layer to moisture, oxygen and the organic light-emitting layer 60, and thus it is possible to allow a high brightness, a high light-emitting efficiency and a long life span to exhibit. Further, it is possible to realize the organic EL device having excellent conservation stability to heat. In addition, in the top emission type, even though the cathode having the first cathode layer (the electron injecting layer) 52 and the second cathode layer 50 is thinned (for example, the film thickness of about 5 nm), it is possible to form the second cathode layer 50 with the material having low reactivity. Thus, it is possible to reduce the reactions of the cathode to moisture, oxygen and the organic light-emitting layer 60. Therefore, it is possible to further improve stability or reliability of the organic EL device using the high-molecular-weight light-emitting material.

Figure 6:
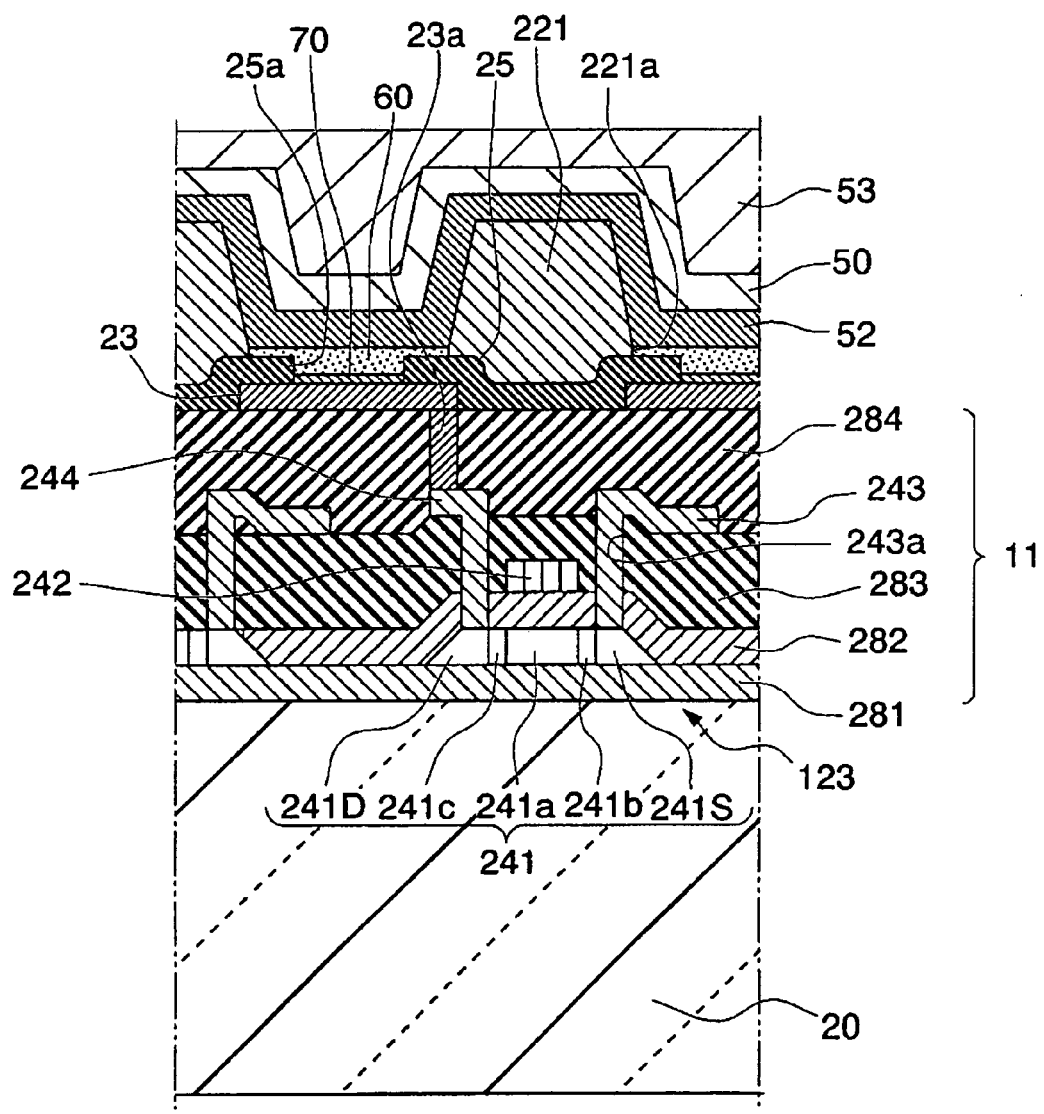
FIG. 6 is an expanded cross-sectional view of essential parts in a modification of a light-emitting element.

Moreover, in the present embodiment, on the uppermost layer of the light-emitting element which is made of a laminate, the second cathode layer 50 is arranged, but, at an outer layer side of the second cathode layer 50, a transparent electrode may be further provided. That is, as shown in FIG. 6, in the case in which the second cathode layer 50 is thinned to configure the top emission type organic EL device, it is apprehended that the resistance of the second cathode layer 50 increases and then the lowering of light-emitting efficiency is caused. However, in the present invention, the transparent electrode 53 such as ITO is provided at the outside of the second cathode layer 50, so that it is possible to reduce the resistance of the electrode at the cathode side while maintaining transmittance.

Figure 7:
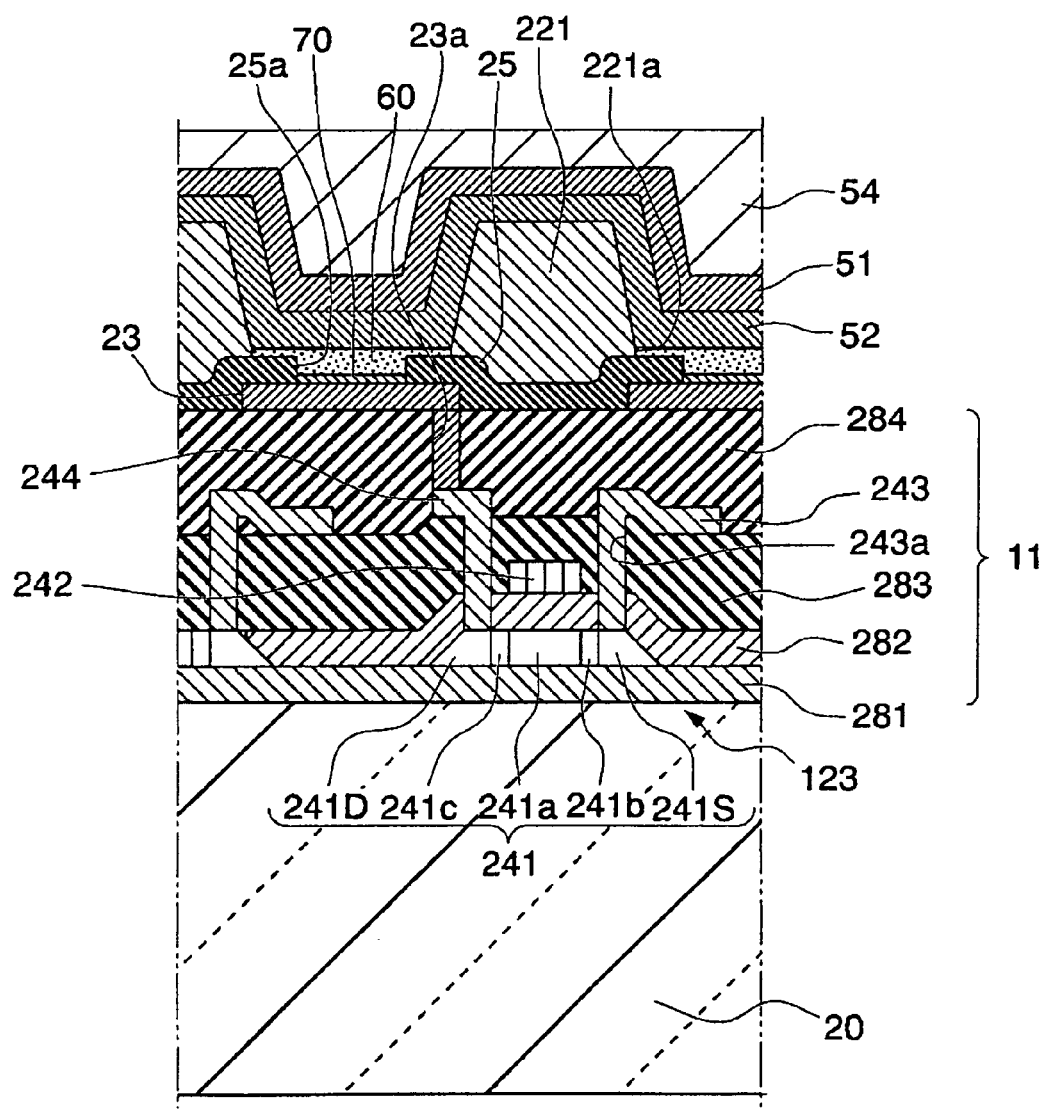
FIG. 7 is an expanded cross-sectional view of essential parts in a modification of a light-emitting element.

Further, as shown in FIG. 7, at the outer layer side of the second cathode layer 50, an insulating film 54 represented by $SiO_xN_y$ (where x and y are integers) may be further provided. In this case, the protection effect to the second cathode layer 50 is obtained, and thus conservation stability is further improved.

In addition, it is possible to use the material, such as magnesium, having low reactivity as the second cathode layer 50, as compared to calcium. Thus, it is possible to reduce the reactions of the cathode to the transparent electrode 53 made of ITO or the insulating film 54 represented by $SiO_xN_y$ (where x and y are integers). Therefore, it is possible to further improve stability or reliability of the organic EL device using the high-molecular-weight light-emitting material.

Figure 8:
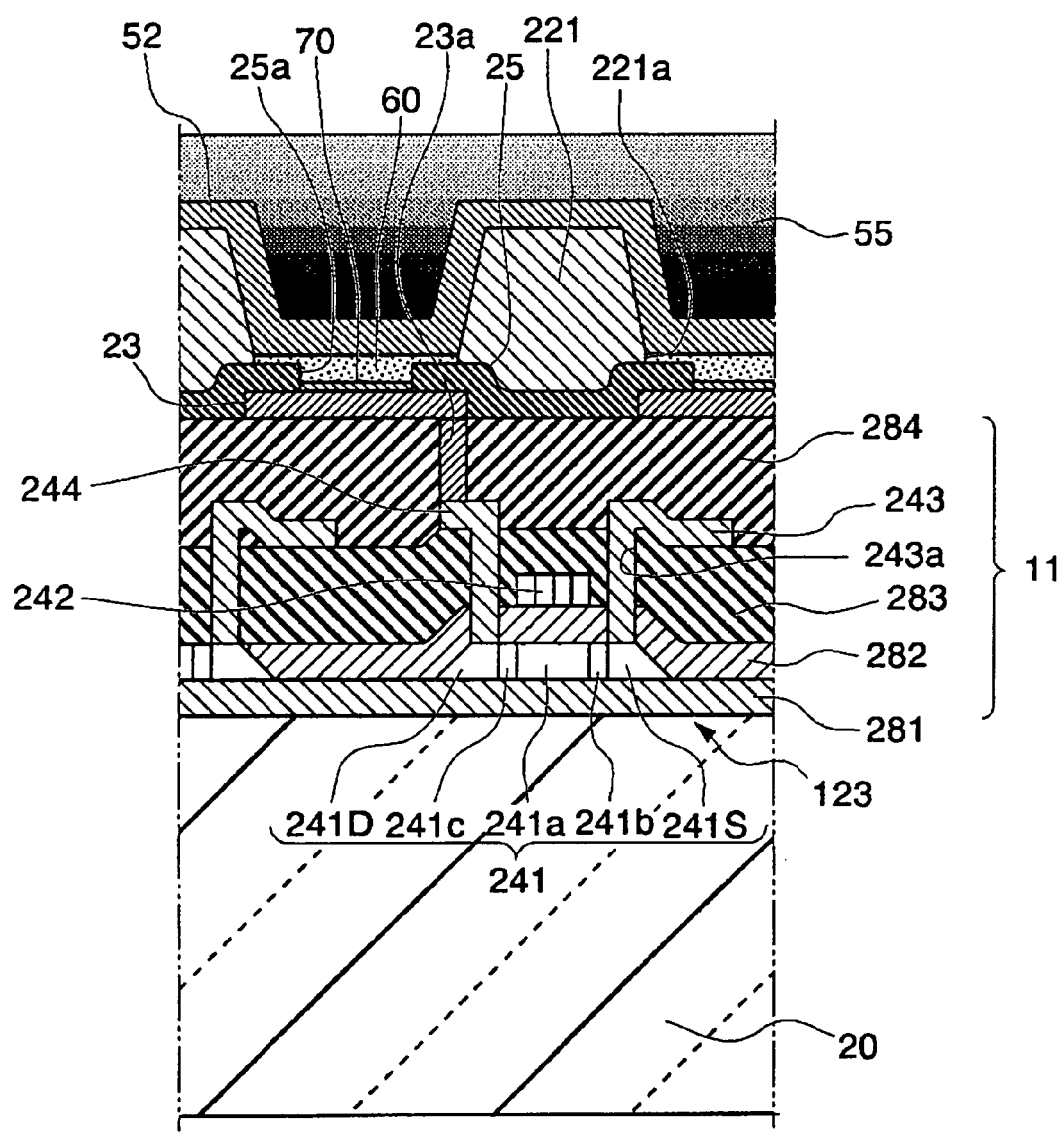
FIG. 8 is an expanded cross-sectional view of essential parts in a modification of a light-emitting element.

Further, as shown in FIG. 8, the second cathode layer 50 may be configured to have an inclination such that the composition ratio of magnesium decreases toward the outer layer side of the second cathode layer 50. In such a manner, the configuration in which the composition ratio of magnesium decreases toward the outside of the cathode is adopted, and thus it becomes possible to make the resistance of the cathode in the thicknesswise direction thereof different. Moreover, in the second cathode layer 50, the weight ratio of magnesium to other metallic material may be set to, for example, about 10:1 to about 1:10. It is apprehended that if magnesium is too much, conservation stability is deteriorated, and if magnesium is too little, the function of the cathode is lowered.

<Manufacturing Method of Organic Electroluminescent Device>

Next, an example of a manufacturing method of the above-mentioned organic EL device 1 will be described with reference to FIGS. 9 to 13. The respective cross-sectional views of FIGS. 9 to 13 correspond to the cross-sectional view taken along the line A-B of FIG. 2.

Figure 9A:
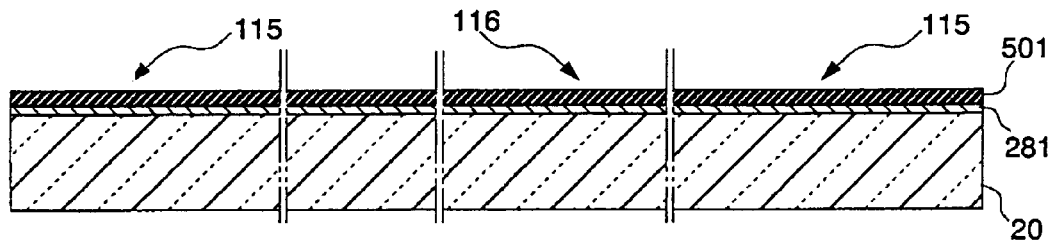
FIGS. 9A–9D are cross sectional views illustrating a manufacturing method of the organic EL device in sequence.

First, as shown in FIG. 9A on the surface of the substrate 20, the base protective layer 281 is formed. Next, on the base protective layer 281, an amorphous silicon layer 501 is formed with an ICVD method or a plasma CVD method, and then crystal particles are grown by means of a laser annealing method or a fast heating method, to thus form a polysilicon layer.

Figure 9B:
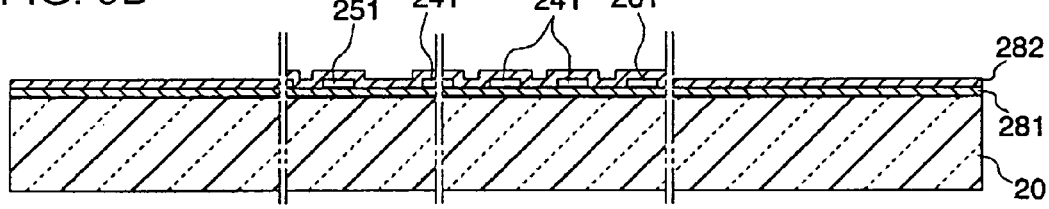

Next, as shown in FIG. 9B the polysilicon layer is patterned by means of a photolithography method, to thus form island-shaped silicon layers 241, 251 and 261. Among them, the silicon layer 241 is formed within the display region and constitutes the driving TFT 123 which is connected to the pixel electrode 23. The silicon layers 251 and 261 constitute the P-channel type and N-channel type TFTs (TFTs for the driving circuit) which is provided in the scanning line driving circuits 80.

Next, the gate insulating layer 282 is formed with a silicon oxide film having a thickness of about 30 nm to 200 nm on an entire surface of the silicon layers 241, 251 and 261, and the base protective layer 281 by means of the plasma CVD method or the thermal oxidization method. Here, when the gate insulating layer 282 is formed by means of the thermal oxidization method, the crystallization of the silicon layers 241, 251 and 261 is also performed, and then the silicon layers can become the polysilicon layer.

Further, in the case in which channel doping is performed to the silicon layers 241, 251 and 261, for example, boron ions are injected with a dose amount of about $1\times10^{12}$ cm$^{-2}$ at that timing. As a result, the silicon layers 241, 251 and 261 becomes a low-doped P-type silicon layer whose the concentration of impurities (calculated by impurities after performing activation annealing) is about $1\times10^{17}$ cm$^{-3}$.

Next, in portions of the channel layers of the P-channel type TFT and the N-channel type TFT, an ion injection mask is formed. In this state, phosphorus ions are injected with a dose amount of about $1\times10^{15}$ cm$^{-2}$. As a result, impurities of high concentration are injected into the patterning mask in a self alignment manner. And then, as shown in FIG. 9C, in the silicon layers 241 and 261, the high-doped source regions 241S and the 261S and the high-doped drain regions 241D and 261D are formed.

Figure 9C:
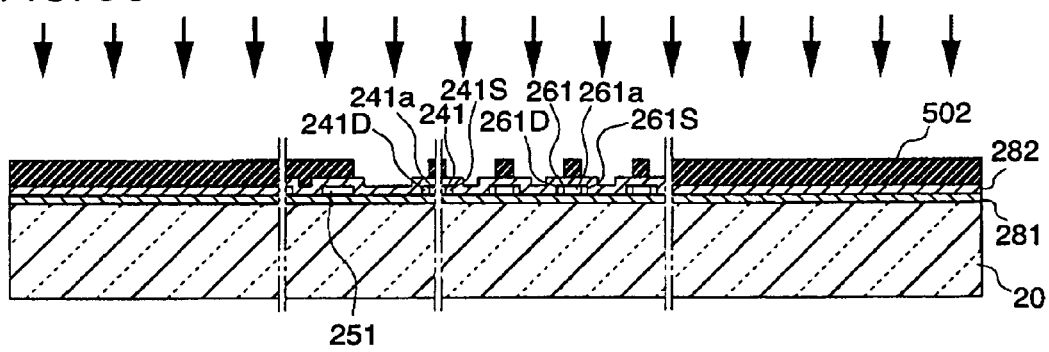
Figure 9D:
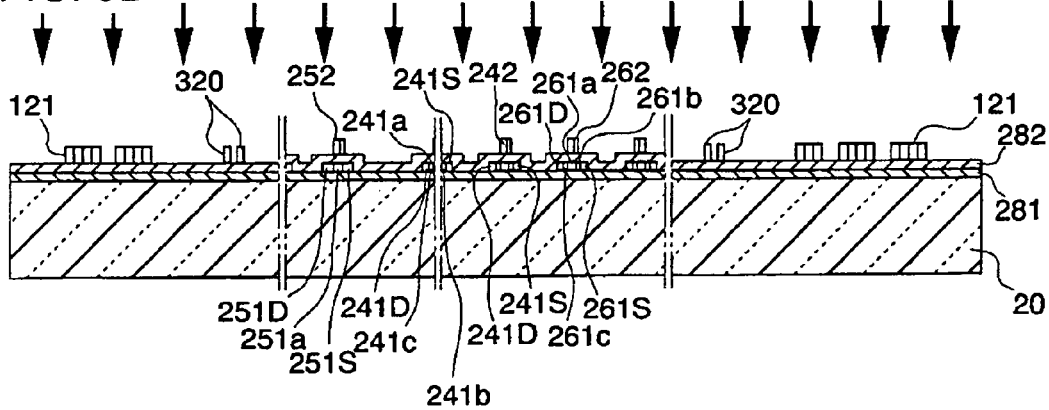

Next, as shown in FIG. 9C, on the entire surface of the gate insulating layer 282, a conductive layer 502 for forming the gate electrode, which is made of a metallic film such as a doped silicon or silicide film, an aluminum film or chromium film, or a tantalum film, is formed. A thickness of the conductive layer 502 is about 500 nm. And then, by means of a patterning method, as shown in FIG. 9D, a gate electrode 252 which forms a P-channel type TFT for the driving circuit, a gate electrode 242 which forms a TFT for the pixel, and a gate electrode 262 which forms an N-channel type TFT for the driving circuit are formed. Further, the driving control signal connecting portion 320 (350) and a first layer 121 of a cathode power supply wiring line are formed simultaneously. Moreover, in this case, the driving control signal connecting portion 320 (350) is arranged in the dummy region 5.

Next, as shown in FIG. 9D by using the gate electrodes 242, 252 and 262 as a mask, phosphorus ions are injected into the silicon layers 241, 251 and 261 with a dose amount of about $4\times10^{13}$ cm$^{-2}$. As a result, impurities having low concentration are injected into the gate electrodes 242, 252 and 262 in a self alignment manner. And then, as shown in FIG. 9D in the silicon layers 241 and 261, the low-doped source regions 241b and 261b and the low-doped drain regions 241c and 261c are formed. Further, in the silicon layer 251, the low-doped impurity regions 251S and 251D are formed.

Figure 10A:
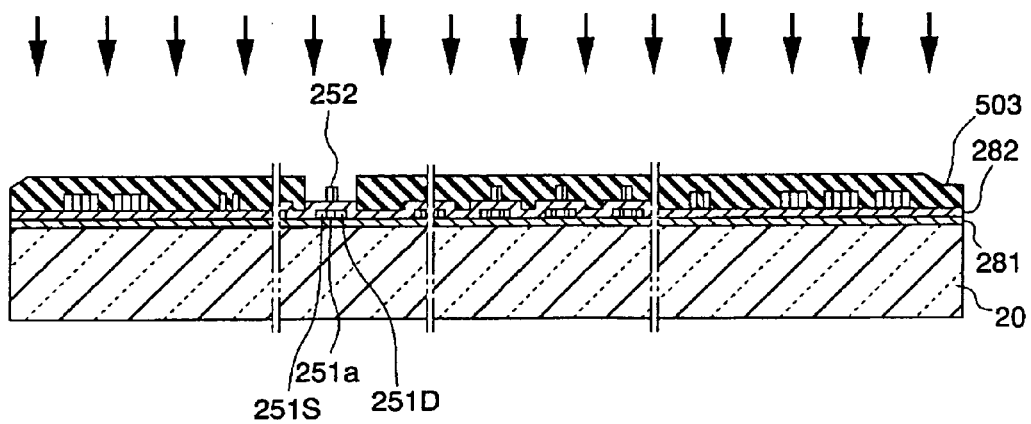
FIGS. 10A–10C are cross sectional views illustrating steps subsequent to FIGS. 9A–9D.

Next, as shown in FIG. 10A an ion injection mask 503 covering portions other than the P-channel type TFT 252 for the driving circuit is formed. By using the ion injection mask 503, boron ions are injected into the silicon layer 251 with a dose amount of about $1.5\times10^{15}$ cm$^{-2}$. As a result, since the gate electrode 252 constituting the P-channel type TFT for the driving circuit also functions as a mask, impurities of high concentration are injected into the silicon layer 251 in a self alignment manner. Therefore, the low-doped impurity regions 251S and 251D are counter-doped, such that source and drain regions of the P-channel type TFT for the driving circuit are formed.

Figure 10B:
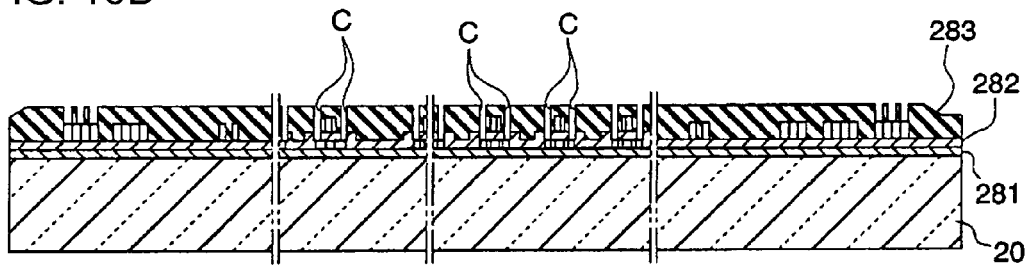

Next, as shown in FIG. 10B over the entire surface of the substrate 20, the first interlayer insulating layer 283 is formed, and simultaneously the first interlayer insulating layer 283 is patterned by means of the photolithography method. As a result, contact holes C are formed at positions corresponding to the source electrode and the drain electrode of the respective TFTs.

Figure 10C:
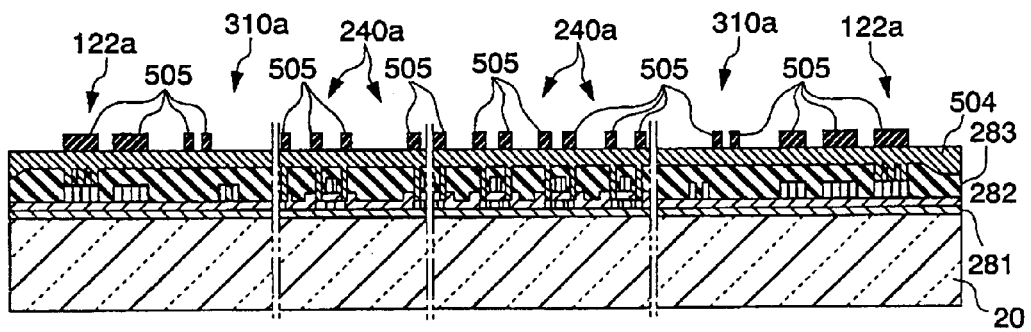
Figure 11A:
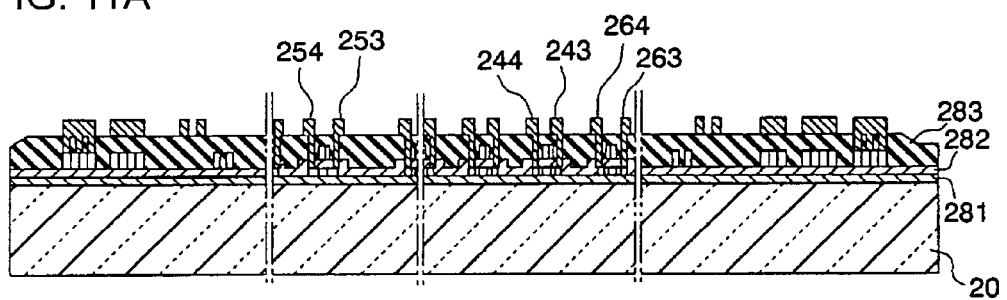
FIGS. 11A–11C are cross sectional views illustrating steps subsequent to FIGS. 10A–10C.
Figure 11B:
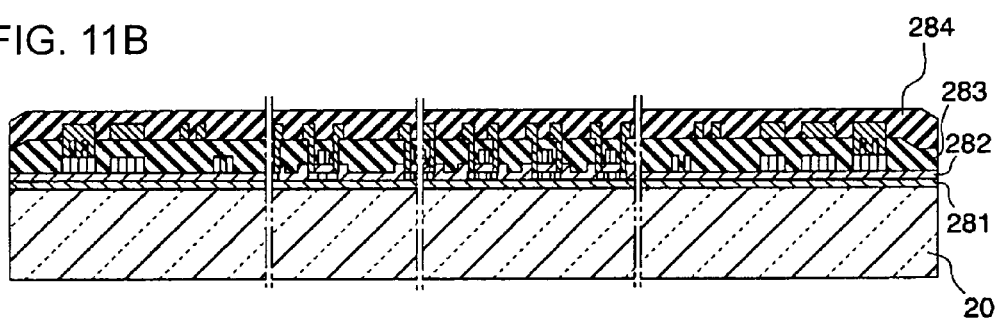

Next, as shown in FIG. 10C, to cover the first interlayer insulating layer 283, a conductive layer 504 made of a metallic material such as aluminum, chromium or tantalum is formed. A thickness of the conductive layer 504 is about 200 nm to 800 nm. And then, among the conductive layer 504, a patterning mask 505 is formed to cover regions 240a in which the source electrode and the drain electrode of the respective TFTs are to be formed, a region 310a in which the driving voltage connecting portion 310 (340) is to be formed, and a region 122a in which a second layer of the cathode power supply wiring line is to be formed. At the same time, the conductive layer 504 is patterned, such that source electrodes 243, 253 and 263 and the drain electrodes 244, 254 and 264 shown in FIG. 11A are formed. Next, as shown in FIG. 11B the second interlayer insulating layer 284 covering the first interlayer insulating layer 283 on which the source and drain electrodes are formed is formed with, for example, a high molecular material such as an acryl-based resin. The second interlayer insulating layer 284 is preferably formed to have a thickness of about 1 to 2 μm. Moreover, the second interlayer insulating layer may be formed with SiN or SiO$_2$, and it is preferable to form the film thickness of about 200 nm in the case of SiN or the film thickness of about 800 nm in the case of SiO$_2$.

Figure 11C:
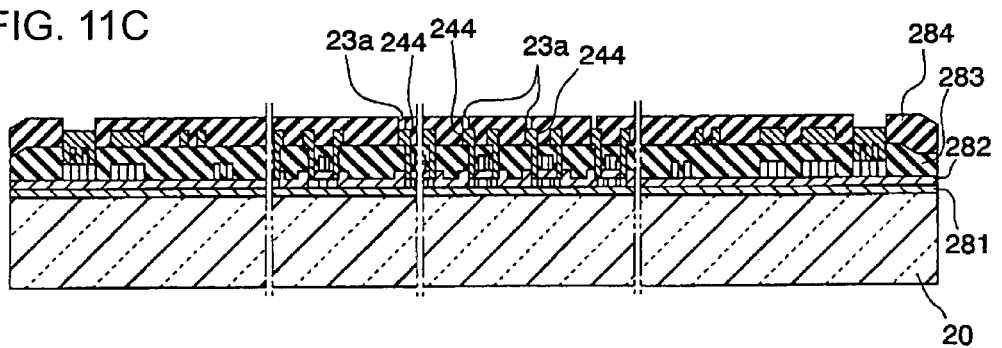
Figure 12A:
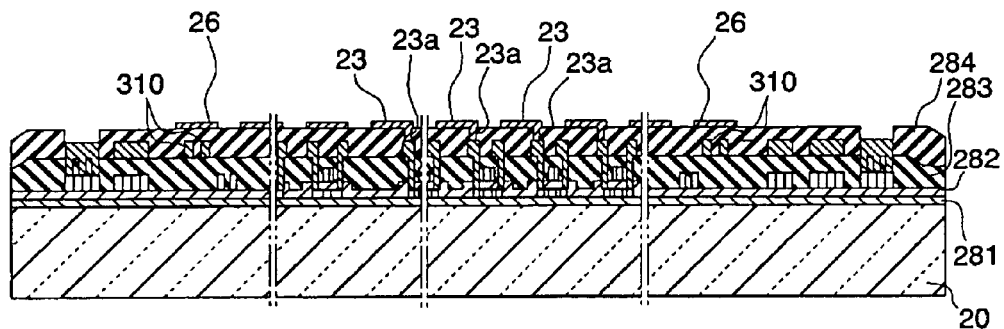
FIGS. 12A–12C are cross sectional views illustrating steps subsequent to FIGS. 11A–11C.

Next, as shown in FIG. 11C among the second interlayer insulating layer 284, a portion corresponding to the drain electrode 244 of the driving TFT is removed by means of etching to form the contact hole 23a. And then, a conductive film constituting the pixel electrode 23 is formed to cover an entire surface of the substrate 20. And then, the transparent conductive film is patterned, and, as shown in FIG. 12A, the pixel electrode 23 which is connected to the drain electrode 244 via the contact hole 23a of the second interlayer insulating layer 284 is formed, and simultaneously a dummy pattern 26 of the dummy region is formed. Moreover, in FIGS. 3 and 4, the pixel electrode 23 and the dummy pattern 26 are collectively referred to as the pixel electrode 23.

The dummy pattern 26 is configured not to connect to a lower metallic wiring line via the second interlayer insulating layer 284. That is, the dummy pattern 26 is arranged in an island shape and has the almost same as the shape of the pixel electrode 23 which is formed in the actual display region. Alternatively, the dummy pattern may have a shape different from that of the pixel electrode 23 which is formed in the display region. Moreover, in this case, the dummy pattern 26 is assumed to include at least one which is positioned above the above-mentioned driving voltage connecting portion 310 (340).

Figure 12B:
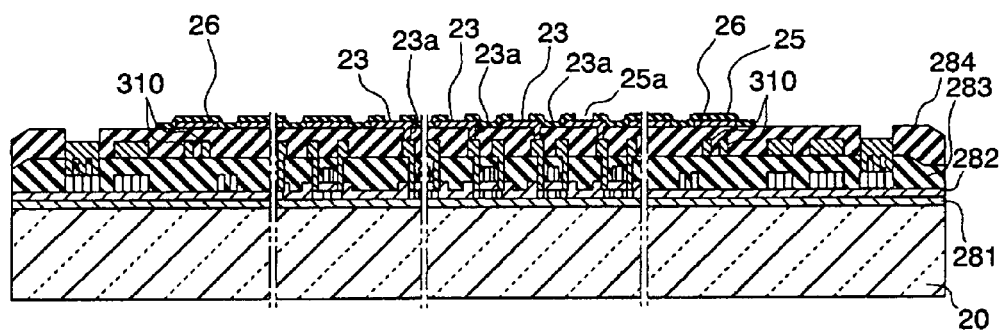

Next, as shown in FIG. 12B, the lyophilic control layer 25 serving as an insulating layer is formed on the pixel electrode 23, the dummy pattern 26 and the second interlayer insulating layer 284. Moreover, on the pixel electrode 23, a portion of the lyophilic control layer 25 is opened, and then, via the opening portion 25a (see FIG. 3), the holes from the pixel electrode 23 can travel. To the contrary, in the dummy pattern 26 in which the opening portion 25a is not provided, the insulating layer (the lyophilic control layer) 25 serves as the hole travel shielding layer, such that the travels of the holes are not caused. Next, in the lyophilic control layer 25, BMs are formed in concave portions which are formed at positions between the adjacent pixel electrodes 23. More specifically, the BMs are film-formed with chromium onto the concave portions of the lyophilic control layer 25 by means of a sputtering method.

Figure 12C:
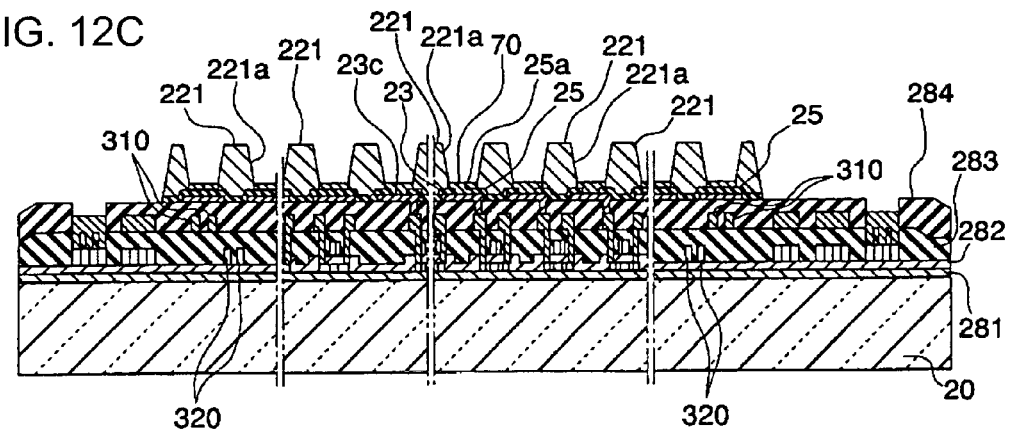

Next, as shown in FIG. 12C, the organic bank layer 221 is formed at a predetermined position of the lyophilic control layer 25, specifically, to cover the above-mentioned BM. As a forming method of the organic bank layer, a material in which a resist such as acryl resin or polyimide resin is melted into a solvent is coated by means of various coating methods such as a spin coat method or a deep coat method, to thus form an organic material layer. Moreover, as a material for forming the organic material layer, what is necessary is that it is not melted in a solvent of ink described below and it is easily patterned by means of etching.

Next, the organic material layer is simultaneously etched by means of the photolithography technology, and the bank opening portion 221a of the organic material layer is formed, and the organic bank layer 221 having a wall surface in the opening portion 221a is formed. Moreover, in this case, the organic bank layer 221 is assumed to include at least one which is positioned above the driving control signal connecting portion 320.

Next, on the surface of the organic bank layer 221, a region exhibiting lyophilic property and a region exhibiting liquid repellency are formed. In the present embodiment, by means of a plasma treatment step, the respective regions are formed. More specifically, the plasma treatment step comprises a preliminary heating step, an ink-lyophilic treatment step of allowing an upper surface of the organic bank layer 221, the wall surface of the opening portion 221a, an electrode surface 23c of the pixel electrode 23, and an upper surface of the lyophilic control layer 25, to have lyophilic property, an ink-repellent treatment step of allowing the upper surface of the organic bank layer and the wall surface of the opening portion to have liquid-repellency, and a cooling step.

That is, a base substrate (the substrate 20 having the bank and so on) is heated at a predetermined temperature, for example, at about 70 to 80° C., and then as the ink-lyophilic treatment step, a plasma treatment using oxygen as a reaction gas ($O_2$ plasma treatment) is performed under an air atmosphere. Next, as the ink-repellent treatment step, a plasma treatment ($CF_4$ plasma treatment) using methane tetrafluoride as a reaction gas is performed under an air atmosphere. And then, the base substrate heated for the plasma treatment is cooled to a room temperature, such that lyophilic property and liquid-repellency are provided at predetermined positions.

Moreover, in the $CF_4$ plasma treatment, the electrode surface 23c of the pixel electrode 23 and the lyophilic control layer 25 are influenced somewhat. However, since ITO serving as the material for forming the pixel electrode 23 and $SiO_2$ or $TiO_2$ serving as the material for forming the lyophilic control layer 25 does not have affinity to fluorine, there is no case in which a hydroxyl group provided in the ink-lyophilic treatment step is substituted with a fluoric group. That is, lyophilic property is maintained.

Figure 13A:
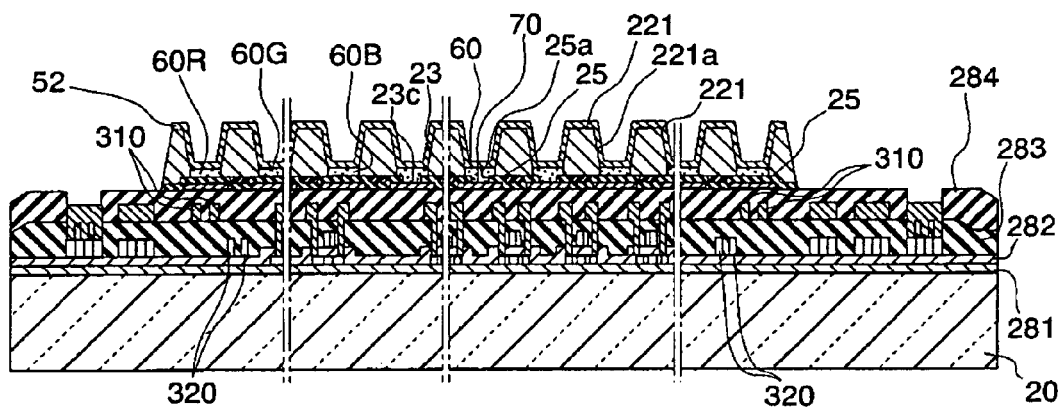
FIGS. 13A–13B are cross sectional views illustrating steps subsequent to FIGS. 12A–12C.

Next, as shown in FIG. 13A a hole injecting/transporting layer forming step of forming the hole injecting/transporting layer 70 is performed. In the hole injecting/transporting layer forming step, in particular, an ink jet method is suitably adopted as a liquid droplet ejection method. That is, by means of the ink jet method, a material for forming the hole injecting/transporting layer is selectively arranged and coated on the electrode surface 23c. And then, a dry treatment and a heat treatment are performed, such that the hole injecting/transporting layer 70 is formed on the pixel electrode 23. As the material for forming the hole injecting/transporting layer 70, for example, a material in which PEDOT: PSS described above is melted into a polar solvent such as isopropylalcohol is used.

Here, in forming the hole injecting/transporting layer 70 by means of the ink jet method, first, the material for forming the hole injecting/transporting layer is filled into an ink jet head (not shown). And then, an ejection nozzle of the ink jet head is adjusted to face the electrode surface 23c which is positioned in the opening portion 25a formed in the lyophilic control layer 25. Subsequently, while the ink jet head and the base substrate (the substrate 20) relatively move, liquid droplets of which the liquid amounts are controlled per one droplet are ejected onto the electrode surface 23c from the ejection nozzle. Next, after the ejection, the liquid droplets are dried, and by evaporating the dispersion or the solvent contained in the material, the hole injecting/transporting layer 70 is formed.

At this time, the liquid droplets ejected from the ejection nozzle are spread on the electrode surface 23c on which the lyophilic treatment is performed and are filled the opening portion 25a of the lyophilic control layer 25. Meanwhile, on the upper surface of the organic bank layer 221 on which the liquid-repellent treatment is performed, the liquid droplets are flipped and not adhered. Therefore, even though the liquid droplets are deviated from a predetermined ejection position, and then a portion of the liquid droplets are caught on the surface of the organic bank layer 221, the surface does not get wet with the liquid droplets. Thus, the liquid droplets landed are inserted into the opening portion 25a of the lyophilic control layer 25. Moreover, in order to prevent oxidization/moisture absorption of various forming materials or formed elements, the steps subsequent to the hole injecting/transporting layer forming step are preferably performed under an inert gas atmosphere such as a nitrogen atmosphere or an argon gas atmosphere.

Next, in order to form the organic light-emitting layer 60, an organic light-emitting layer forming step is performed. In this step, similarly to the formation of the above-mentioned hole injecting/transporting layer 70, the ink jet method functioning as the liquid droplet ejection method is suitably adopted. That is, by means of the ink jet method, a material for forming the organic light-emitting layer is ejected on the hole injecting/transporting layer 70, and then, by performing the dry treatment and the heat treatment, the organic light-emitting layer 60 is formed within the opening portion 221a which is formed in the organic bank layer 221, that is, on the pixel region. In the organic light-emitting layer forming step, in order to prevent the hole injecting/transporting layer 70 from being remelted, a nonpolar solvent which does not melt the hole injecting/transporting layer 70 is used as a solvent of a material ink to be used for the formation of the organic light-emitting layer. Further, as regards the formation of the organic light-emitting layer 60, the above-mentioned step is formed for each color.

Next, in order to form the first cathode layer (the electron injecting layer) 52 on the organic light-emitting layer 60, a first cathode layer forming step is performed. As the first cathode layer (the electron injecting layer) 52, the fluoride of the alkali metallic material, specifically, lithium fluoride (LiF) is used, but, other than this material, the oxide of the alkali metallic material, the fluoride or oxide of the alkali earth metallic material, or the complex or compound of the organic material may be used. In particular, lithium fluoride is preferable in that it can be formed at a low temperature and it is a semiconductor and an insulator having the band gap. As a method of forming the first cathode layer (the electron injecting layer) 52, a known method such as a vacuum deposition method can be used.

Figure 13B:
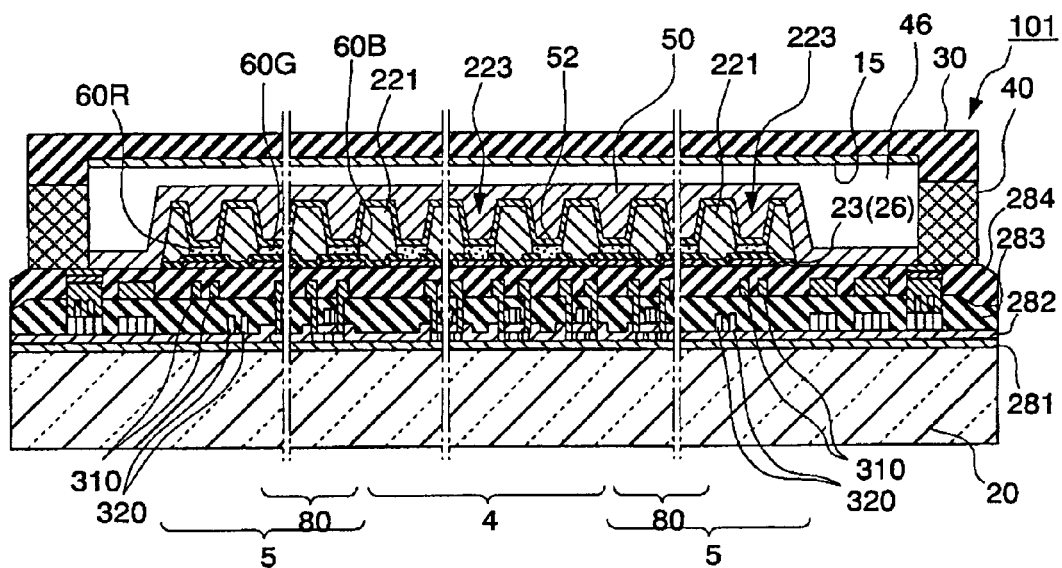

Subsequently, as shown in FIG. 13B in order to form the second cathode layer 50, a second cathode layer forming step is performed by means of a vapor deposition method. In this step, by means of a vacuum deposition method, the magnesium alloy is film-formed on the entire surface of an exposed portion of the first cathode layer (the electron injecting layer) 52. The alloy of magnesium (Mg) and silver (Ag) is preferable in that it has a nature that magnesium educed on the surface during manufacturing reacts to oxygen and becomes a magnesium oxide which improves gas barrier property to moisture or oxygen. Further, as the atoms having the work functions between 3.0 eV and 4.0 eV, which are used as the second cathode layer, scandium (the work function of 3.5 eV), yttrium (the work function of 3.1 eV), lanthanum (the work function of 3.5 eV), arsenic (the work function of 3.75 eV) or the like may be used. And then, finally, in order to form the sealing substrate 30, a sealing step is performed. In the sealing step, the sealing substrate 30 and the substrate 20 are sealed with an adhesive 40 while inserting a drying agent 45 inside the sealing substrate 30. Moreover, the sealing step is preferably performed under an inert gas atmosphere such as nitrogen, argon, helium or the like.

Further, when the magnesium alloy is used, it is possible to reduce the reactions to lithium fluoride which is used for the first cathode layer (the electron injecting layer) 52 in the cathode, as compared to the case of using a single substance of magnesium. Further, it is possible to reduce diffusions of the atoms constituting the first cathode layer (the electron injecting layer) 52 inside the organic light-emitting layer 60. In particular, in the case in which the organic light-emitting layer 60 is formed by using the liquid method such as the liquid droplet ejection method, the organic light-emitting layer 60 is formed by ejecting the liquid material for forming the organic light-emitting layer, which contains the solvent, on the hole injecting/transporting layer 70 and then removing the solvent by means of the dry treatment and the heat treatment. When the solvent is removed in such a manner, minute holes are formed in the organic light-emitting layer 60. For this reason, the atoms constituting the first cathode layer (the electron injecting layer) 52 are easily diffused inside the organic light-emitting layer 60. On the organic light-emitting layer 60 formed in such a manner, the thin film of lithium fluoride is formed as the first cathode layer (the electron injecting layer) 52, and then the second cathode layer 50 is formed with the magnesium alloy. Thus, as regards the organic light-emitting layer 60 which is formed by means of the liquid method such as the liquid droplet ejection method, it is possible to further suppress the problem that the atoms constituting the first cathode layer (the electron injecting layer) 52 are diffused inside the organic light-emitting layer 60, which results in making the characteristics of the organic EL element unstable.

EXAMPLE

Next, with regard to the organic EL device 1, light-emitting efficiency and life span property are evaluated.

More specifically, in the cathode configurations according to comparative examples 1 and 2 and an example 1, light-emitting efficiency and life span property for the respective colors (red (R), green (G) and blue (B)) are compared. In the comparative example 1, the first layer is made of calcium and the second layer is made of aluminum, and in the comparative example 2, the first layer is made of lithium fluoride/calcium and the second layer is made of aluminum. Meanwhile, in the example 1, the first layer is made of lithium fluoride and the second layer is made of the alloy of magnesium and silver. As the high-molecular-weight light-emitting material emitting blue (B), PFM whose LUMO level is 2.1 eV is used. Further, as the high-molecular-weight light-emitting material emitting green (G), F8BT whose LUMO level is 3.4 eV is used. In addition, as the high-molecular-weight light-emitting material emitting red (R), PAT whose LUMO level is 3.3 eV is used. The results are shown in Table 1 (light-emitting efficiency) and Table 2 (life span property). Moreover, in the Table 1 and Table 2, as regards light-emitting efficiency, relative values when red (R) in the comparative example 1 is set to '1' are shown. Further, as regards life span property, relative values when blue (B) in the comparative example 2 is set to '1' are shown.

TABLE 1

| | COMPARATIVE EXAMPLE 1 | COMPARATIVE EXAMPLE 2 | EXAMPLE 1 |
|---|---|---|---|
| R | 1 | 0.3 | 1 |
| G | 1 | 1.1 | 1.3 |
| B | 0.2 | 1 | 1.1 |

TABLE 2

| | COMPARATIVE EXAMPLE 1 | COMPARATIVE EXAMPLE 2 | EXAMPLE 1 |
|---|---|---|---|
| R | 1 | 1 | 1.5 |
| G | 1 | 0.8 | 1.9 |
| B | 0.01 | 1 | 1 |

As seen from the table 1, in the cathode configuration of the comparative example 1, light-emitting efficiency of blue (B) is deteriorated, and in the cathode configuration of the comparative example 2, light-emitting efficiency of red (R) is deteriorated. Meanwhile, it can be seen that the cathode configuration of the example 1 exhibits excellent light-emitting efficiency for all colors. Further, as seen from the table 2, in the cathode configuration of the comparative example 1, the life span of blue (B) is short, and in the cathode configuration of the comparative example 2, the life span of green (G) is short. Meanwhile, it can be seen that the cathode configuration of the example 1 exhibits high life span property for all colors. That is, in the organic EL device 1 of the present embodiment, the cathode is formed with lithium fluoride (the first layer) and an alloy of magnesium and silver (the second layer). Thus, it can be seen that, even though the cathode configuration is common for all colors, the organic EL device 1 of the present embodiment exhibits excellent light-emitting efficiency and life span property for all colors.

Electronic Apparatus

Figure 14:
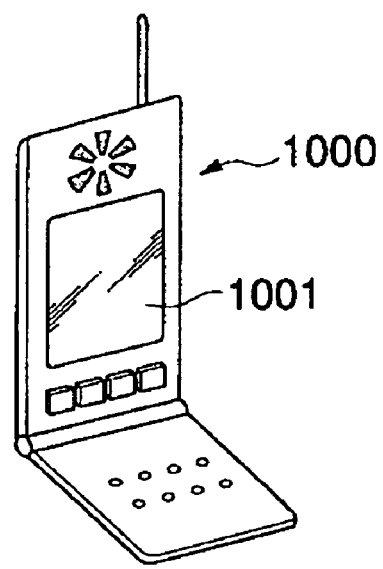
FIG. 14 is a perspective view showing an example of an electronic apparatus of the present invention.

Next, a specified example of an electronic apparatus comprising the organic EL device of the present invention will be described. The electronic apparatus of the present invention has the organic EL device described above as a display unit, and specifically, one shown in FIG. 14 may be exemplified. FIG. 14 is a perspective view showing an example of a cellular phone. In FIG. 14, a reference numeral 1000 denotes a main body of the cellular phone, and a reference numeral 1001 denotes a display unit which uses the organic EL device described above. The electronic apparatus shown in FIG. 14 comprises the display unit having the organic EL device described above. Thus, it is possible to obtain a long life span and a bright display.

What is claimed is:

1. An organic electroluminescent device comprising a plurality of organic light-emitting elements each having a laminate in which an organic light-emitting layer is interposed between an anode and a cathode,
wherein the organic light-emitting layer is made of a high-molecular-weight light-emitting material,
the plurality of organic light-emitting elements include a first organic light-emitting element having a first organic light-emitting material which has a first lowest unoccupied molecular orbital (LUMO) level, and a second organic light-emitting element having a second organic light-emitting material which has a second LUMO level, the first LUMO level is a highest LUMO level among organic light-emitting materials constituting the plurality of organic light-emitting elements, the second LUMO level being a lowest LUMO level among the organic light-emitting materials constituting the plurality of organic light-emitting elements, and
the cathode is formed common to the first organic light-emitting element and the second organic light-emitting element, and the cathode has a first layer and a second layer,
the first layer being made of a fluoride or oxide of an alkali metallic material, a fluoride or oxide of an alkali earth metallic material, or a complex or compound of an organic material, and
the second layer containing atoms whose work functions are different from the first LUMO level by less than 0.7 eV, and
the first layer and the second layer being sequentially deposited on the organic light-emitting layer.

2. The organic electroluminescent device according to claim 1, wherein
the first LUMO level is in a range of from 3.0 eV to 3.5 eV,
the second LUMO level is in a range of from 2.0 eV to 2.5 eV, and
the second layer contains atoms whose work functions are in a range of from 3.0 eV to 4.0 eV.

3. The organic electroluminescent device according to claim 1, wherein
the first layer is made of lithium fluoride, and
the difference between the work functions of at least one of the atoms constituting the second layer and the second LUMO level is less than 2.0 eV.

4. The organic electroluminescent device according to claim 1, wherein the second layer is made of one or more alloys selected from a group consisting of an alloy of magnesium and silver, an alloy of magnesium and aluminum, and an alloy of magnesium and chromium.

5. The organic electroluminescent device according to claim 1, the second layer being an outermost layer of the laminate.

6. The organic electroluminescent device according to claim 1, further including a transparent electrode covered on an outer side of the second layer.

7. The organic electroluminescent device according to claim 1, a SiOxNy (where x and y are integers) protective film covered on an outer side of the second layer.

8. The organic electroluminescent device according to claim 1, the second layer having an inclination such that the composition ratio of magnesium decreases toward the outer layer thereof.

9. The organic electroluminescent device according to claim 1, the second layer being an alloy containing magnesium and a metallic material, the weight ratio of magnesium to the metallic material being 10:1 to 1:10.

10. An organic electroluminescent device, comprising:
a substrate and an organic light-emitting element having a laminate in which an organic light-emitting layer is interposed between an anode and a cathode,
the organic light-emitting layer being made of a high-molecular-weight light-emitting material,
the organic light-emitting element having the organic light-emitting layer whose LUMO level is in a range of from 2.0 eV to 2.5 eV, and
the cathode having a first layer made of lithium fluoride and a second layer made of one or more alloys selected from a group consisting of an alloy of magnesium and silver, an alloy of magnesium and aluminum, and an alloy of magnesium and chromium, the first layer and the second layer being sequentially deposited on the organic light-emitting layer.

11. An electronic apparatus, comprising:
the organic electroluminescent device according to claim 1.

12. A method of manufacturing an organic electroluminescent device, comprising:
forming an anode on a substrate;
forming a functional layer having an organic light-emitting layer on the anode with a liquid method;
forming a first cathode layer made of a fluoride or oxide of an alkali metallic material, a fluoride or oxide of an alkali earth metallic material, or a complex or compound of an organic material, on the functional layer; and
forming a second cathode layer made of one or more alloys selected from a group consisting of an alloy of magnesium and silver, an alloy of magnesium and aluminum, and an alloy of magnesium and chromium, on the first layer of the cathode.

* * * * *